US012720892B2

(12) United States Patent
Joung et al.

(10) Patent No.: US 12,720,892 B2
(45) Date of Patent: Aug. 25, 2026

(54) IMAGE SENSOR AND METHOD OF MANUFACTURING THE SAME

(71) Applicant: Samsung Electronics Co., Ltd., Suwon-si (KR)

(72) Inventors: Yoongi Joung, Hwaseong-si (KR); Junghyun Kim, Suwon-si (KR); Gyeongjin Lee, Suwon-si (KR); Junsik Lee, Suwon-si (KR); Jonghoon Park, Seoul (KR); Yunki Lee, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 581 days.

(21) Appl. No.: 18/061,800

(22) Filed: Dec. 5, 2022

(65) Prior Publication Data

US 2023/0290804 A1 Sep. 14, 2023

(30) Foreign Application Priority Data

Mar. 14, 2022 (KR) ........................ 10-2022-0031242

(51) Int. Cl.
*H10F 39/00* (2025.01)
*H10F 39/18* (2025.01)

(52) U.S. Cl.
CPC ....... *H10F 39/8063* (2025.01); *H10F 39/024* (2025.01); *H10F 39/182* (2025.01); *H10F 39/806* (2025.01); *H10F 39/807* (2025.01)

(58) Field of Classification Search
None
See application file for complete search history.

(56) References Cited

U.S. PATENT DOCUMENTS

| | | | | |
|---|---|---|---|---|
| 9,419,035 | B2 | 8/2016 | Wu et al. | |
| 2006/0066922 | A1 | 3/2006 | Nishi | |
| 2008/0011936 | A1* | 1/2008 | Kuo | H10F 39/8063 250/208.1 |
| 2008/0020299 | A1 | 1/2008 | Lee | |

(Continued)

FOREIGN PATENT DOCUMENTS

| | | | |
|---|---|---|---|
| JP | 2006-093456 | A | 4/2006 |
| JP | 6631004 | B2 | 1/2020 |

(Continued)

OTHER PUBLICATIONS

Title: Translation of KR20060068480A Author: Chang Chong Kwang Date: Jun. 21, 2006 (Year: 2006).*

*Primary Examiner* — Twyler L Haskins
*Assistant Examiner* — Wesley J Chiu
(74) *Attorney, Agent, or Firm* — Fish & Richardson P.C.

(57) ABSTRACT

A method of manufacturing an image sensor includes forming a first chip structure including a circuit wiring structure, forming a second chip structure on the first chip structure, the second chip structure including a plurality of photoelectric conversion device regions, forming a lens material layer on the second chip structure, forming an isolation groove defining a plurality of lens regions in the lens material layer, forming internal grooves in the plurality of lens regions of the lens material layer surrounded by the isolation groove, and forming lens patterns using the lens material layer in which the isolation groove and the internal grooves are formed.

18 Claims, 23 Drawing Sheets

(56) References Cited

U.S. PATENT DOCUMENTS

| | | | | |
|---|---|---|---|---|
| 2009/0225205 | A1* | 9/2009 | Takagi | G02B 3/0018 348/294 |
| 2009/0261440 | A1* | 10/2009 | Kawasaki | H10F 39/024 257/E31.127 |
| 2011/0311919 | A1* | 12/2011 | Yang | H10F 39/024 430/321 |
| 2014/0306360 | A1* | 10/2014 | Li | G02B 3/0043 264/1.7 |
| 2017/0171470 | A1* | 6/2017 | Sakioka | H04N 25/134 |
| 2017/0338265 | A1* | 11/2017 | Yoshiba | H10F 39/8057 |
| 2019/0339422 | A1* | 11/2019 | Lu | G03F 7/0007 |
| 2021/0013249 | A1 | 1/2021 | Yang | |
| 2021/0043673 | A1* | 2/2021 | Kwon | H10F 39/811 |
| 2022/0139996 | A1* | 5/2022 | Lin | H10F 39/8063 257/432 |

FOREIGN PATENT DOCUMENTS

| | | | | |
|---|---|---|---|---|
| KR | 20060068480 | A * | 6/2006 | H10F 39/811 |
| KR | 10-0802292 | B1 | 2/2008 | |
| KR | 10-0988779 | B1 | 10/2010 | |
| KR | 10-2011-0079336 | A | 7/2011 | |

* cited by examiner

IMAGE SENSOR AND METHOD OF MANUFACTURING THE SAME

CROSS-REFERENCE TO RELATED APPLICATION

This application claims benefit of priority to Korean Patent Application No. 10-2022-0031242 filed on Mar. 14, 2022 in the Korean Intellectual Property Office, the inventive concepts of which is incorporated herein by reference in its entirety.

BACKGROUND

Example embodiments of the present inventive concepts relate to image sensors and methods of manufacturing the same.

An image sensor is a semiconductor-based sensor generating an electrical signal by receiving light, and may include a pixel array having a plurality of pixels, a logic circuit for driving the pixel array and generating an image, and the like. Each of the pixels may include a photodiode and a pixel circuit converting electric charges generated by the photodiode into an electric signal.

SUMMARY

Some example embodiments of the present inventive concepts provide an image sensor including a microlens having an improved or optimized curvature.

According to some example embodiments of the present inventive concepts, a method of manufacturing an image sensor includes forming a first chip structure including a circuit wiring structure, forming a second chip structure on the first chip structure, the second chip structure including a plurality of photoelectric conversion device regions, forming a lens material layer on the second chip structure, forming an isolation groove defining a plurality of lens regions in the lens material layer and internal grooves in the plurality of lens regions of the lens material layer surrounded by the isolation groove, and forming lens patterns using the lens material layer in which the isolation groove and the internal grooves are formed.

According to some example embodiments of the present inventive concepts, a method of manufacturing an image sensor includes forming a first chip structure including a circuit wiring structure, forming a second chip structure including a plurality of photoelectric conversion device regions on the first chip structure, forming a lens material layer on the second chip structure, forming an isolation groove defining a first lens region and a second lens region in the lens material layer, a first internal groove in the first lens region of the lens material layer, and a second internal groove in the second lens region of the lens material layer, and forming lens patterns having different curvatures using the lens material layer in which the isolation groove and the first and second internal grooves are formed, wherein the first internal groove has a shape different from a shape of the second internal groove.

According to some example embodiments of the present inventive concepts, a method of manufacturing an image sensor includes forming a chip structure including a photoelectric conversion device region, forming a lens material layer on the chip structure, forming an isolation groove and a first internal groove and a second internal groove surrounded by the isolation groove in the lens material layer, and forming lens patterns using the lens material layer in which the isolation groove, the first internal groove, and the second internal groove are formed, wherein the lens patterns include a first lens pattern and a second lens pattern having different heights.

BRIEF DESCRIPTION OF DRAWINGS

The above and other aspects, features, and advantages of the present inventive concepts will be more clearly understood from the following detailed description, taken in combination with the accompanying drawings, in which.

DETAILED DESCRIPTION

Figure 1:
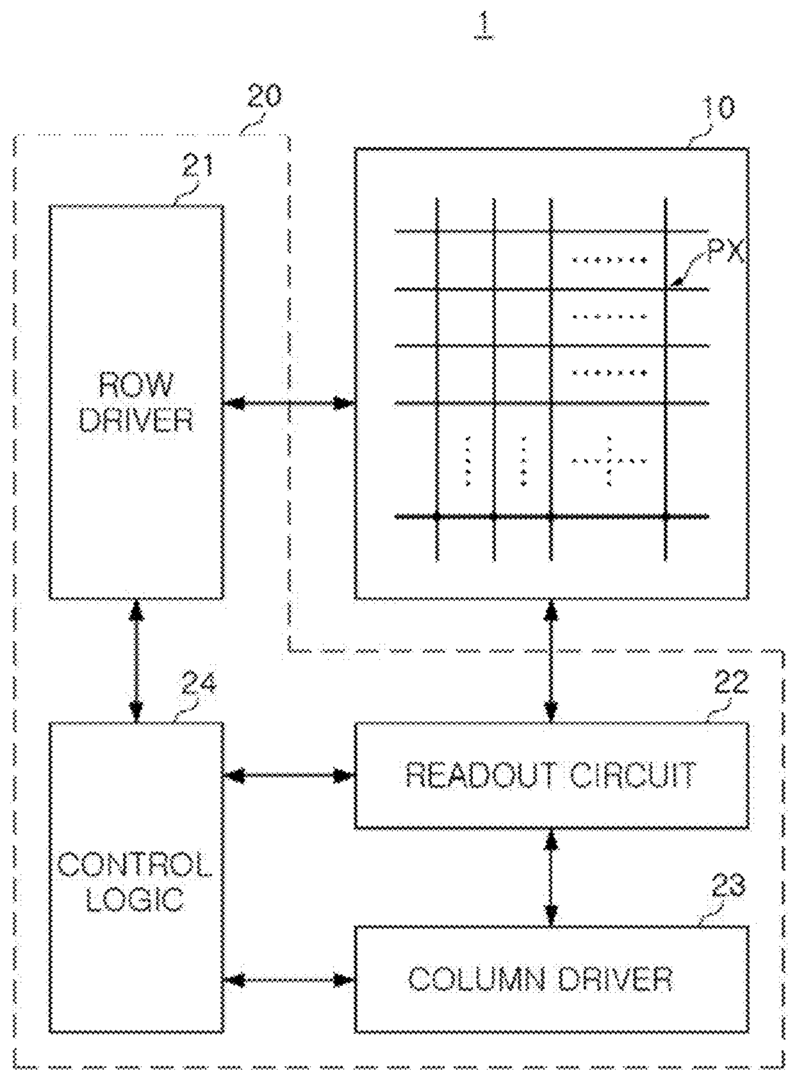
FIG. 1 is a block diagram illustrating an image sensor according to some example embodiments of the present inventive concepts.

Hereinafter, terms such as 'on', 'top portion', 'top surface', 'below', 'bottom portion', 'bottom surface', 'side surface', 'upper end', 'lower end' may be understood that is made to the drawings, except for cases, that denoted by reference numerals and are referred to separately. Terms such as "upper", "middle" and "lower" will be replaced with other terms, for example, "first", "second", and "third", etc. to be used to describe elements of the specification. Terms such as "first", "second" and "third" may be used to describe various components, but the components are not limited by the terms, and "first component" means "may be referred to as "second component".

Hereinafter, "curvature" may mean an average curvature of a corresponding component. Also, "curvature in a specific direction" may mean an average curvature of a corresponding component in the cross-sectional view in the specific direction.

It will be understood that when an element is referred to as being "on" another element, it may be directly on the other element or intervening elements may also be present. In contrast, when an element is referred to as being "directly on" another element, there are no intervening elements present. It will further be understood that when an element is referred to as being "on" another element, it may be above or beneath or adjacent (e.g., horizontally adjacent) to the other element.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%)).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

While the term "same," "equal" or "identical" may be used in description of some example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

As described herein, when an operation is described to be performed "by" performing additional operations, it will be understood that the operation may be performed "based on" the additional operations, which may include performing said additional operations alone or in combination with other further additional operations.

As described herein, an element that is described to be "spaced apart" from another element, in general and/or in a particular direction (e.g., vertically spaced apart, laterally spaced apart, etc.) and/or described to be "separated from" the other element, may be understood to be isolated from direct contact with the other element, in general and/or in the particular direction (e.g., isolated from direct contact with the other element in a vertical direction, isolated from direct contact with the other element in a lateral or horizontal direction, etc.). Similarly, elements that are described to be "spaced apart" from each other, in general and/or in a particular direction (e.g., vertically spaced apart, laterally spaced apart, etc.) and/or are described to be "separated" from each other, may be understood to be isolated from direct contact with each other, in general and/or in the particular direction (e.g., isolated from direct contact with each other in a vertical direction, isolated from direct contact with each other in a lateral or horizontal direction, etc.).

Hereinafter, some example embodiments of the present inventive concepts will be described as follows with reference to the accompanying drawings.

FIG. 1 is a block diagram illustrating an image sensor according to some example embodiments.

Referring to FIG. 1, an image sensor 1 may include a pixel array 10 and a logic circuit 20.

The pixel array 10 may include a plurality of pixels PX arranged in an array form along a plurality of rows and a plurality of columns. Each of the plurality of pixels PX may include at least one photoelectric conversion device generating an electric charge in response to light, and a pixel circuit generating a pixel signal corresponding to an electric charge generated by the photoelectric conversion device. The photoelectric conversion device may include a photodiode formed of a semiconductor material, and/or an organic photodiode formed of an organic material.

In some example embodiments, the pixel circuit may include a floating diffusion, a transfer transistor, a reset transistor, a driving transistor, and a select transistor. A configuration of the plurality of pixels PX may vary in some example embodiments. For example, each of the plurality of pixels PX may include an organic photodiode including an organic material, or may be implemented as a digital pixel. When the plurality of pixels PX are implemented as digital pixels, each of the pixels PX may include an analog-to-digital converter for outputting a digital pixel signal.

The logic circuit 20 may include circuits for controlling the pixel array 10. For example, the logic circuit 20 may include a row driver 21, a readout circuit 22, a column driver 23, and a control logic 24. The row driver 21 may drive the pixel array 10 in units of row lines. For example, the row driver 21 may generate a transfer control signal for controlling the transfer transistor of the pixel circuit, a reset control signal for controlling the reset transistor, and a select control signal for controlling the select transistor, and may input the signals to the pixel array 10 by row line units.

The readout circuit 22 may include a correlated double sampler (CDS) and an analog-to-digital converter (ADC). The correlated double samplers may be connected to the plurality of pixels PX through column lines. The correlated double samplers may read a pixel signal through column lines from the pixel PX connected to a row line selected by a row line select signal from the row driver 21. The analog-to-digital converter may convert the pixel signal detected by the correlated double sampler into a digital pixel signal and may transmit the signal to the column driver 23.

The column driver 23 may include a latch or buffer circuit for temporarily storing a digital pixel signal, an amplifier circuit, and the like, and may process a digital pixel signal received from the readout circuit 22. The row driver 21, the readout circuit 22, and the column driver 23 may be controlled by the control logic 24. The control logic 24 may include a timing controller for controlling operation timings of the row driver 21, the readout circuit 22, and the column driver 23.

Among the plurality of pixels PX, pixels PX disposed in the same position in the horizontal direction may share the same column line. In an example, the pixels PX disposed in the same position in the vertical direction among the plurality of pixels PX may be simultaneously selected by the row driver 21 and may output a pixel signal through column lines. In an example, the readout circuit 22 may simultaneously obtain a pixel signal from the plurality of pixels PX selected by the row driver 21 through column lines. The pixel signal may include a reset voltage and a pixel voltage, and the pixel voltage may be obtained by reflecting electric charges generated in response to light in each of the plurality of pixels PX in the reset voltage.

As described herein, any devices, electronic devices, chip structures, chips, modules, units, and/or portions thereof according to any of the example embodiments, and/or any portions thereof (including, without limitation, the image sensor 1, the pixel array 10, the logic circuit 20, the row driver 21, the read-out circuit 22, the column driver 23, the control logic 24, the chip structure 3, the first chip structure 103, the second chip structure 203, or the like) may include, may be included in, and/or may be implemented by one or more instances of processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a graphics processing unit (GPU), an application processor (AP), a digital signal processor (DSP), a microcomputer, a field programmable gate array (FPGA), and programmable logic unit, a microprocessor, application-specific integrated circuit (ASIC), a neural network processing unit (NPU), an Electronic Control Unit (ECU), an Image Signal Processor (ISP), and the like. In some example embodiments, the processing circuitry may include a non-transitory computer readable storage device (e.g., a memory), for example a solid state drive (SSD), storing a program of instructions, and a processor (e.g., CPU) configured to execute the program of instructions to implement the functionality and/or methods performed by some or all of any devices, electronic devices, modules, units, and/or portions thereof according to any of the example embodiments.

Any of the memories, memory chips, or the like as described herein may be a non-transitory computer readable medium and may store a program of instructions. Any of the memories described herein may be a nonvolatile memory, such as a flash memory, a phase-change random access memory (PRAM), a magneto-resistive RAM (MRAM), a resistive RAM (ReRAM), or a ferro-electric RAM (FRAM), or a volatile memory, such as a static RAM (SRAM), a dynamic RAM (DRAM), or a synchronous DRAM (SDRAM).

Figure 2A:
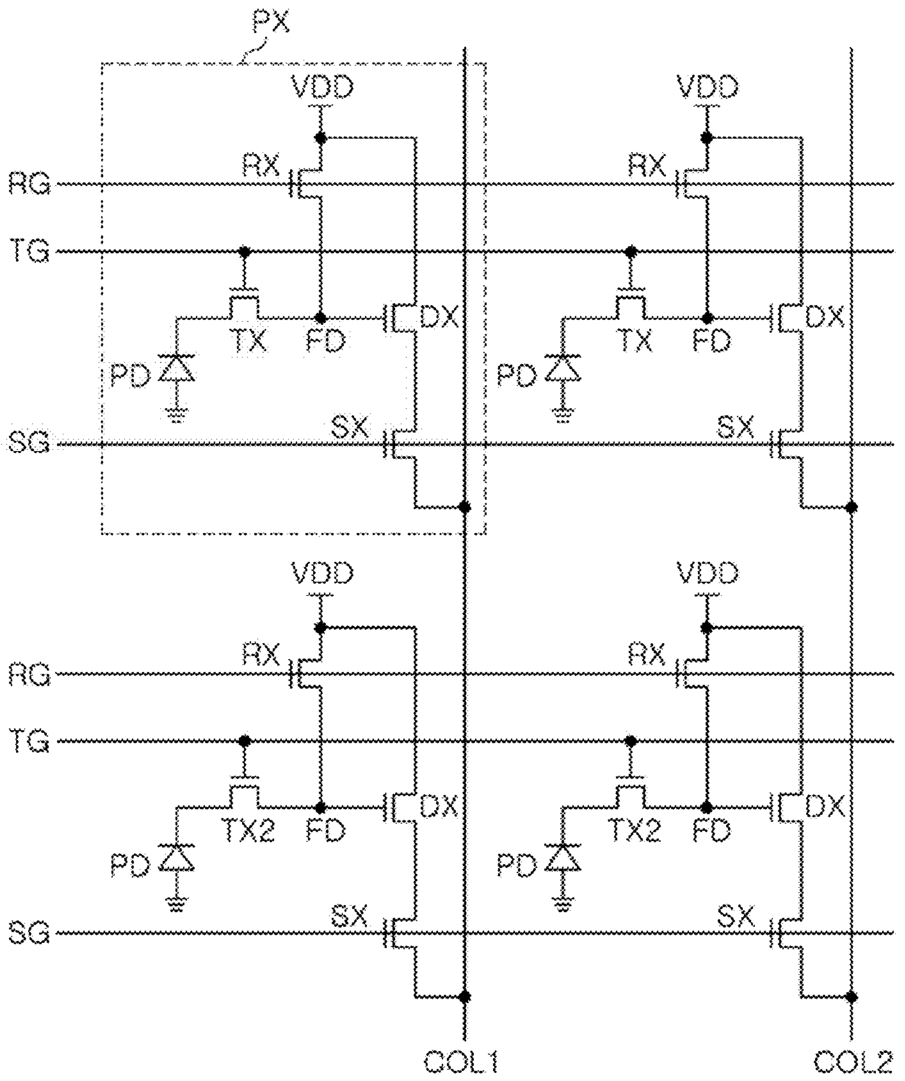
FIGS. 2A and 2B are diagrams illustrating examples of a pixel circuit of an image sensor according to some example embodiments of the present inventive concepts.
Figure 2B:
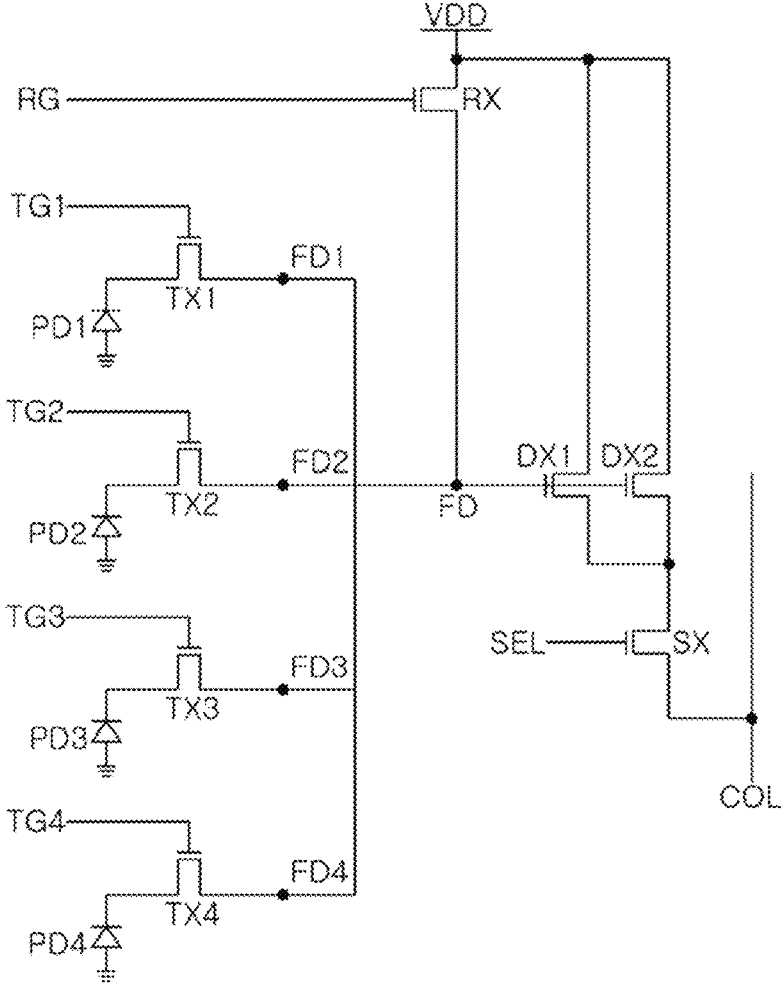

FIGS. 2A and 2B are diagrams illustrating examples of a pixel circuit of an image sensor according to some example embodiments. Various examples of a pixel circuit of an image sensor according to some example embodiments will be described with reference to FIGS. 2A and 2B.

In some example embodiments, referring to FIGS. 1 and 2A, each of the plurality of pixels PX may include a photodiode PD and a pixel circuit, and the pixel circuit may include a transfer transistor TX, a reset transistor RX, a select transistor SX, and a driving transistor DX.

The photodiode PD may generate and accumulate electric charges in response to externally incident light. The pixel circuit may further include a floating diffusion region FD in which electric charges generated by the photodiode PD are accumulated.

The photodiode PD may be replaced with a phototransistor, a photogate, or a pinned photodiode in some example embodiments. In some example embodiments, the photodiode PD may be referred to as a "photoelectric conversion device." The photoelectric conversion device may include a photodiode, a phototransistor, a photogate, or a pinned photodiode.

The transfer transistor TX may move electric charges generated in the photodiode PD to the floating diffusion region FD. The floating diffusion region FD may store electric charges generated by the photodiode PD. A voltage output from the driving transistor DX may vary depending on the amount of charge accumulated in the floating diffusion region FD.

The reset transistor RX may reset a voltage of the floating diffusion region FD by removing electric charges accumulated in the floating diffusion region FD. A drain electrode of the reset transistor RX may be connected to the floating diffusion region FD, and a source electrode of the reset transistor RX may be connected to the power voltage VDD. When the reset transistor RX is turned on, the power voltage VDD connected to the source electrode of the reset transistor RX may be applied to the floating diffusion region FD, and electric charges accumulated in the floating diffusion region FD may be removed.

The driving transistor DX may operate as a source follower buffer amplifier. The driving transistor DX may amplify a voltage change in the floating diffusion region FD and may output the voltage change to one of the column lines COL1 or COL2. The select transistor SX may select the pixels PX to be read in row units. When the select transistor SX is turned on, a voltage of the driving transistor DX may be output to one of the column lines COL1 or COL2. When the select transistor SX is turned on, a reset voltage or a pixel voltage may be output through the column lines COL1 and COL2.

In some example embodiments, including the example embodiments illustrated in FIG. 2A, each of the plurality of pixels PX may include a photodiode PD and a transfer transistor TX, as well as a reset transistor RX, a select transistor SX, and a driver transistor DX, but some example embodiments thereof are not limited thereto, and may be modified as illustrated in FIG. 2B.

In a modified example, referring to FIGS. 1 and 2B, two or more pixels PX adjacent to each other may share at least a portion of the transistors included in the pixel circuit. For example, four adjacent pixels may share a floating diffusion region FD, a reset transistor RX, first and second driving transistors DX1 and DX2, and a select transistor SX.

In some example embodiments, the first photodiode PD1 of the first pixel and the first transfer transistor TX1 may be connected to the floating diffusion region FD. Similarly, the second to fourth photodiodes PD2-PD4 of the second to fourth pixels may be connected to the floating diffusion region FD through the second to fourth transfer transistors TX2-TX4.

In an example, the first to fourth transfer transistors TX1-TX4 may be connected to the floating diffusion region FD in common by connecting the floating diffusion regions FD included in each of the pixels to each other by a wiring pattern.

In another example, the floating diffusion region FD included in each of the pixels may be integrated with each other in a substrate formed of a semiconductor material.

The pixel circuit may include a reset transistor RX, first and second driving transistors DX1 and DX2, and a select transistor SX. The reset transistor RX may be controlled by the reset control signal RG, and the select transistor SX may be controlled by the select control signal SEL. For example, each of the four pixels may further include one transistor in addition to the transfer transistor TX. Two of the four transistors included in the four pixels may be connected in parallel and may provide first and second driving transistors DX1 and DX2, and one of the other two transistors may be provided as a select transistor SX, and the other may provide the reset transistor RX.

The pixel circuit described with reference to FIG. 2B is only some example embodiments, and some example embodiments thereof are not limited thereto. For example, one of the four transistors may be allocated as a driving transistor and another may be allocated as a select transistor. Also, by connecting the other two in series to each other and allocating the transistors as the first and second reset transistors, an image sensor for adjusting a conversion gain of a pixel may be implemented. Alternatively, the pixel circuit may vary depending on the number of transistors included in each of the pixels. As described above, the pixel circuits described with reference to FIGS. 2A and 2B are examples for implementing the image sensor according to some example embodiments, and some example embodiments thereof are not limited thereto.

A method of manufacturing an image sensor according to some example embodiments will be described with reference to FIGS. 3 to 5D.

Figure 3:
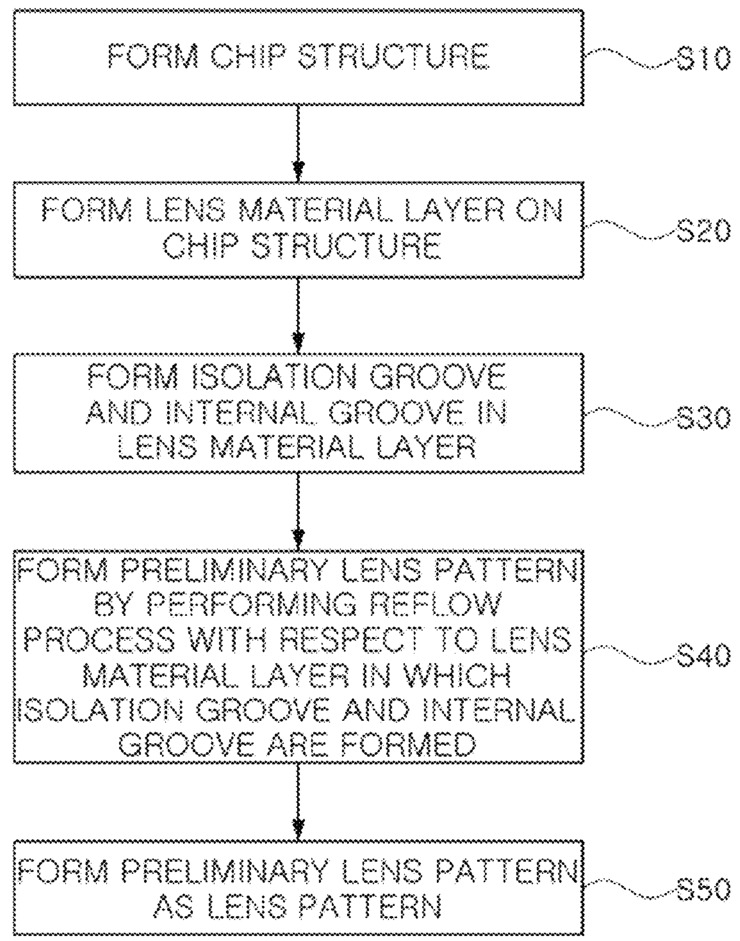
FIG. 3 is a flowchart illustrating a method of manufacturing an image sensor according to some example embodiments of the present inventive concepts.
Figure 4A:
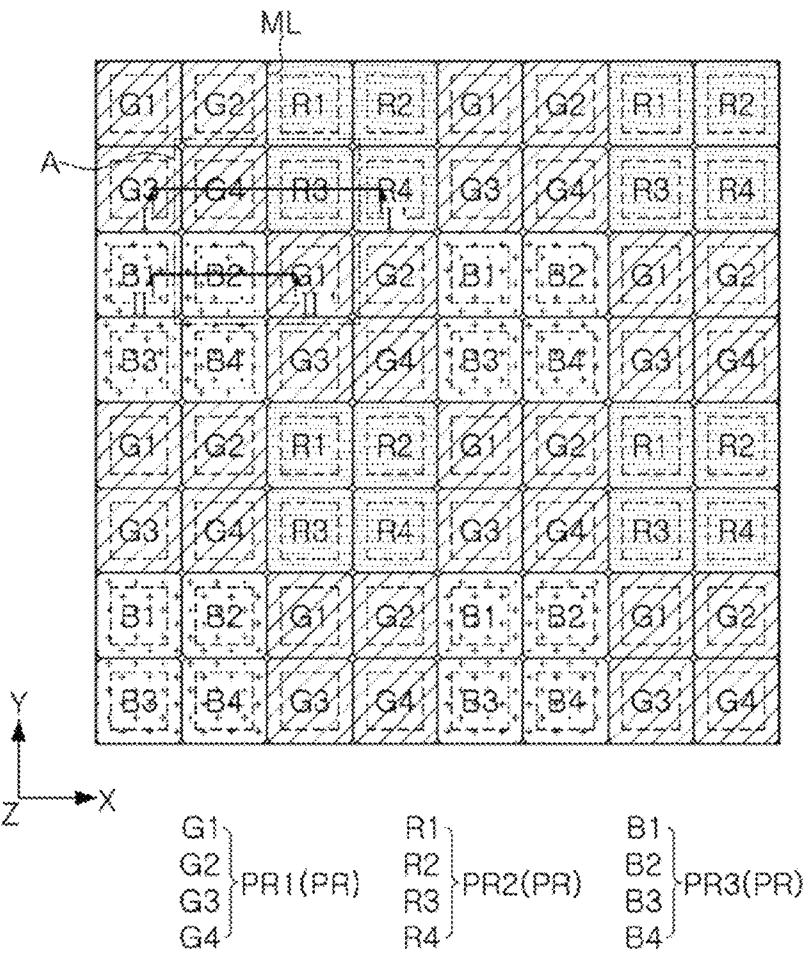
FIGS. 4A, 4B, 5A, 5B, 5C, and 5D are plan diagrams and cross-sectional diagrams illustrating a method of manufacturing an image sensor according to some example embodiments of the present inventive concepts.
Figure 4B:
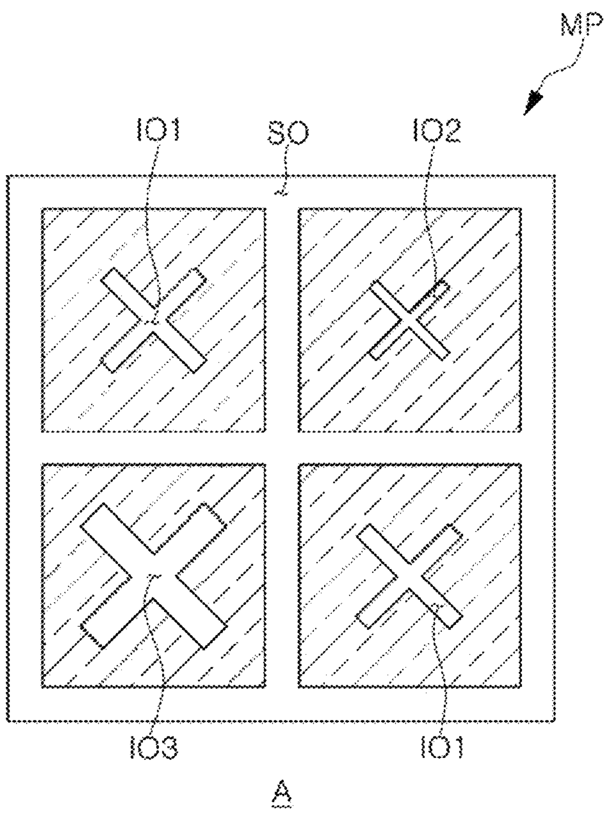

FIG. 3 is a flowchart illustrating a method of manufacturing an image sensor according to some example embodiments. FIGS. 4A, 4B, 5A, 5B, 5C, and 5D are plan diagrams and cross-sectional diagrams illustrating a method of manufacturing an image sensor according to some example embodiments. FIG. 4A is a plan diagram illustrating an image sensor according to some example embodiments, and FIG. 4B is a plan diagram illustrating an example of a mask pattern used in a region corresponding to region "A" in FIG. 4A. FIGS. 5A to 5D are cross-sectional diagrams taken along lines I-I' and II-II' in FIG. 4A.

Figure 5A:
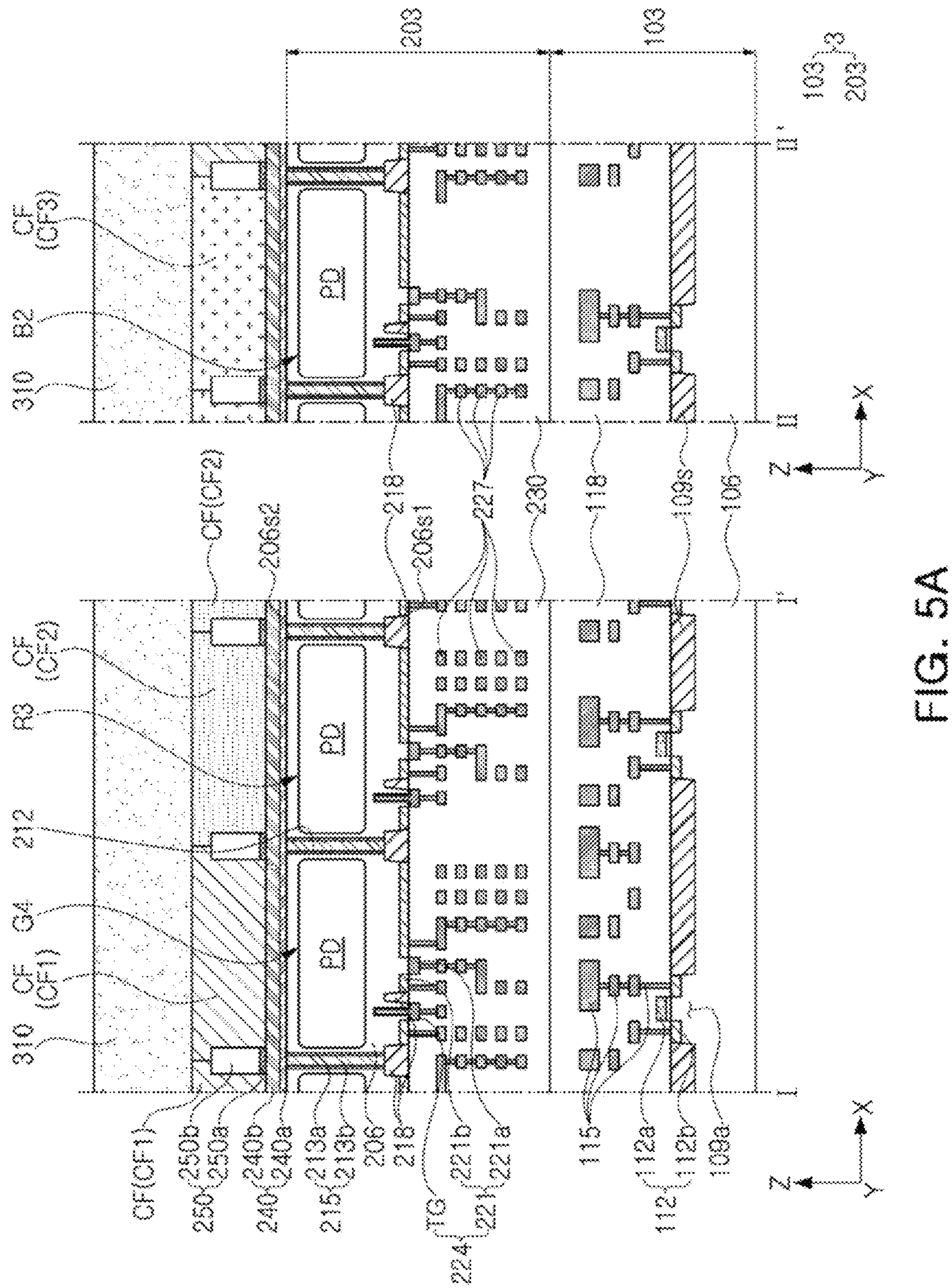

Referring to FIGS. 3, 4A, and 5A together, a chip structure 3 may be formed (S10), and a lens material layer 310 may be formed on the chip structure (S20).

The first chip structure 103 including a first circuit device 112 may be formed. A device isolation layer 109*s* defining the active region 109*a* may be formed on the first substrate 106, and a first circuit device 112 may be formed on the first substrate 106. Thereafter, a first wiring structure 115 electrically connected to the first circuit device 112 on the first substrate 106, and a first insulating structure 118 covering the first circuit device 112 and the first wiring structure 115 may be formed. In some example embodiments, by forming the first wiring structure 115 and the first insulating structure 118 multiple times, the first wiring structure 115 may be formed to include wiring lines disposed on a plurality of levels. The first circuit device 112 and the first wiring structure 115 may be referred to as a circuit wiring structure.

The second chip structure 203 including the photoelectric conversion device regions PD may be formed. Forming the second chip structure 203 may include forming an isolation structure 215 and a photoelectric conversion device regions PD in the second substrate 206, forming a device isolation layer 218 defining an active region on the first surface 206*s*1 of the second substrate 206, forming a second circuit device 224 on the first surface 206*s*1 of the second substrate 206, and forming a second wiring structure 227 on the first surface 206*s*1 of the second substrate 206, and a second insulating structure 230 covering the second circuit device 224 and the second wiring structure 227. The order of forming the isolation structure 215, the photoelectric conversion device regions PD, and the device isolation layer 218 may be varied.

In some example embodiments, the second chip structure 203 may include pixel groups PR each including at least one photoelectric conversion device region PD. Each of the pixel groups PR may be configured by a unit of a photoelectric conversion device region in which different color filters are formed through a subsequent process. For example, the pixel groups PR may include a first pixel group PR1 in which a first color filter is formed, a second pixel group PR2 in which a second color filter is formed, and a third pixel group PR3 in which a third color filter is formed.

The chip structure 3 may be formed by bonding the first chip structure 103 to the second chip structure 203. In some example embodiments, the chip structure 3 may be formed by performing a wafer bonding process for bonding two wafers. Accordingly, the first insulating structure 118 of the first chip structure 103 and the second insulating structure 230 of the second chip structure 203 may be bonded to each other. In an example, the isolation structure 215 may be exposed by performing a grinding process for reducing the thickness of the second substrate 206.

The insulating structure 240 may be formed on the second surface 206*s*2 of the second substrate 206, and the grid structure 250 may be formed on the insulating structure 240. Color filters CF covering the grid structure 250 may be formed on the insulating structure 240. The color filters CF may include a first color filter CF1, a second color filter CF2, and a third color filter CF3 having different colors (e.g., configured to selectively transmit light in different wavelength regions corresponding to different colors).

The lens material layer 310 may be formed on the color filters CF. The lens material layer 310 may conformally cover the color filters CF. The lens material layer 310 may be formed of a TMR-based resin (manufactured by Tokyo Ohka Kogo, Co.) or an MFR-based resin (manufactured by Japan Synthetic Rubber Corporation), but some example embodiments thereof are not limited thereto.

Referring to FIGS. 3, 4A, 4B, and 5B together, an isolation groove SG and internal grooves IG may be formed in the lens material layer 310 (S30).

Figure 5B:
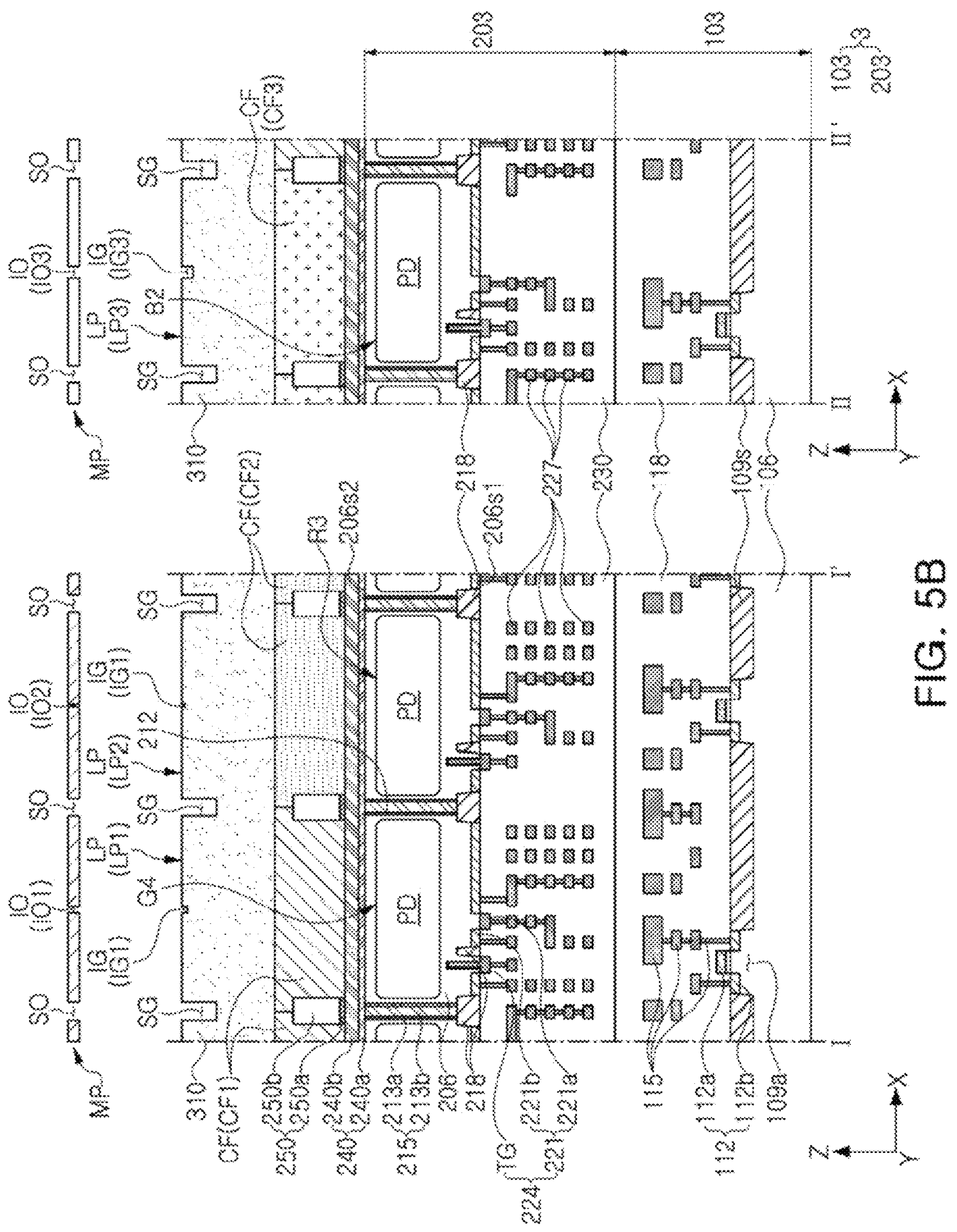

The isolation groove SG and the internal grooves IG may be formed by an exposure and etching process using the mask pattern MP. In this specification, the mask pattern MP may be referred to as a photo mask pattern. Referring to FIGS. 4B and 5B, the mask pattern MP may include an isolation opening SO corresponding to the isolation groove SG and internal openings IO corresponding to the internal grooves IG. However, differently from the above example, in the mask pattern MP, the mask material layer may be formed in the region corresponding to the isolation groove SG and the internal groove IG, and the openings may be formed in the other region depending on the type of the lens material layer 310 and the conditions of the exposure process.

The lens material layer 310 may include a plurality of lens regions LP isolated by an isolation groove SG. The plurality of lens regions LP may be lens material layer regions for forming the plurality of microlenses ML. In some example embodiments, the plurality of lens regions LP may not refer to the plurality of microlenses ML.

In some example embodiments, the plurality of lens regions LP may include first to third lens regions LP1, LP2, and LP3. The first lens region LP1 of the lens material layer 310 may include a first internal groove IG1, the second lens region LP2 of the lens material layer 310 may include a second internal groove IG2, and the third lens region LP3 of the lens material layer 310 may include a third internal groove IG3. However, in some example embodiments, at least one of the first to third lens regions LP1, LP2, or LP3 may not include an internal groove. The first to third internal grooves IG1, IG2, and IG3 may have different shapes.

In a plan diagram, each of the plurality of lens regions LP may be defined by an isolation groove SG. In some example embodiments, each of the plurality of lens regions LP may overlap the photoelectric conversion device region PD in the Z direction. However, in some example embodiments, each of the plurality of lens regions LP may overlap the plurality of photoelectric conversion device regions PD in the Z direction. In some example embodiments, the isolation groove SG may overlap the grid structure 250 in the Z direction. On a plane, each of the plurality of lens regions LP may have a square shape, but some example embodiments thereof are not limited thereto.

The internal grooves IG may be at least one groove formed by patterning in the plurality of lens regions LP isolated by the isolation groove SG. The internal grooves IG may be surrounded by the isolation groove SG. At least one of the internal grooves IG, for example, the first internal groove IG1 may have a shape of a combination of lines extending in a direction perpendicular to each other, but some example embodiments thereof are not limited thereto. In some example embodiments, the number the internal grooves IG disposed in the lens region LP and the shape of the internal grooves IG may be varied. Also, the internal grooves IG may be formed to have different shapes, that is, for example, different widths, for each of the plurality of lens regions LP.

The isolation groove SG and the internal grooves IG may be grooves recessed by a predetermined depth from the upper surface of the lens material layer 310. The depth by which the isolation groove SG and the internal grooves IG are recessed may be proportional to the width of the grooves. In some example embodiments, as illustrated in FIG. 5B, the isolation groove SG may have a width greater than the width of each of the internal grooves IG, and may be recessed by a depth greater than the depth by which each of the internal grooves IG is recessed.

As illustrated in FIG. 4B, the mask pattern MP may include the isolation opening SO, the first internal openings IO1 provided in the region corresponding to the first lens region LP1, the second internal openings IO2 in a region corresponding to the second lens region LP2, and third internal openings IO3 in a region corresponding to third lens region LP3. The isolation opening SO may be a region corresponding to the isolation groove SG, and the first to third internal openings IO1, IO2, and IO3 may be regions vertically overlapping the first to third internal grooves IG1, IG2, and IG3. In some example embodiments, each of the first to third internal openings IO1, IO2, and IO3 may have a shape of a combination of an opening having a line shape extending in a first horizontal direction (e.g., a direction rotated by 45 degrees from the X direction) and an opening having a line shape extending in a second horizontal direction (e.g., a direction rotated by −45 degrees from the X direction) intersecting the first horizontal direction. However, the width of the first internal openings IO1 may be greater than the width of the second internal openings IO2 and smaller than the width of the third internal openings IO3.

Referring to FIGS. 4B and 5B together, as the width of the first internal openings IO1 is greater than the width of the second internal openings IO2, the width of the first internal groove IG1 may be greater than the width of the second internal groove IG2, and the depth by which the first internal groove IG1 is recessed may be greater than a depth by which the second internal groove IG2 is recessed. Similarly, as the width of the first internal openings IO1 is smaller than the width of the third internal openings IO3, the width of the first internal groove IG1 may be smaller than the width of the third internal groove IG3, and the depth by which the first internal groove IG1 is recessed may also be smaller than the depth by which the third internal groove IG3 is recessed.

The internal grooves IG may reduce the curvature of the microlenses ML (see FIG. 8) formed through a subsequent process. As the area and/or position of the internal grooves IG is adjusted in the lens regions LP, the internal grooves IG may be controlled to have different curvatures in each direction in the microlens ML or the microlenses ML may be configured to have different curvatures.

Figure 5C:
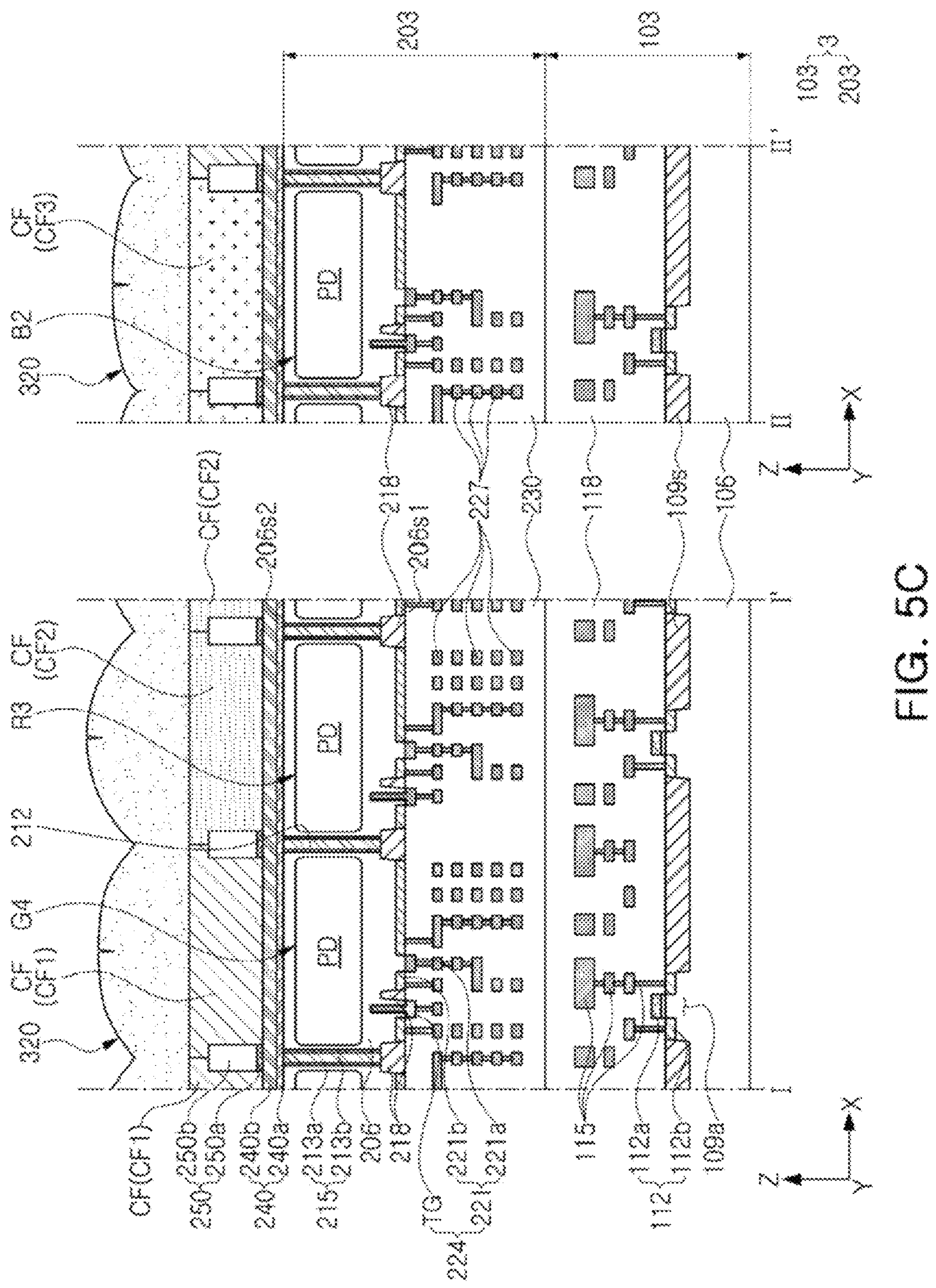

Referring to FIGS. 3 and 5C together, a reflow process may be performed on the lens material layer 310 in which the isolation groove SG and the internal grooves IG are formed, thereby forming a preliminary lens pattern 320 (S40).

A reflow process may be performed by applying a constant temperature to the lens material layer 310. By performing the reflow process on the lens material layer 310, a preliminary lens pattern 320 having a specific curvature may be formed.

The lens material layer 310 may flow in a direction toward the isolation groove SG through the reflow process. Accordingly, each of the plurality of lens regions LP may have a specific curvature.

The lens material layer 310 may flow in a direction toward the internal grooves IG through the reflow process. Accordingly, the internal grooves IG may relatively lower the curvature of the preliminary lens pattern 320.

The curvature of the preliminary lens pattern 320 may be variously controlled according to the width, depth, and formation direction of the internal grooves IG. For example, since the first internal groove IG1 has a width greater than that of the second internal groove IG2 or has a depth greater than a depth of the second internal groove IG1, the effect of reducing the curvature may be relatively greater in the reflow process. Accordingly, the curvature of the preliminary lens pattern 320 may be adjusted by the first to third internal grooves IG1, IG2, and IG3 having different shapes.

A method of controlling the curvature will be described in greater detail along with the shapes of the internal openings of the various mask pattern regions in FIGS. 6A to 6E.

Figure 5D:
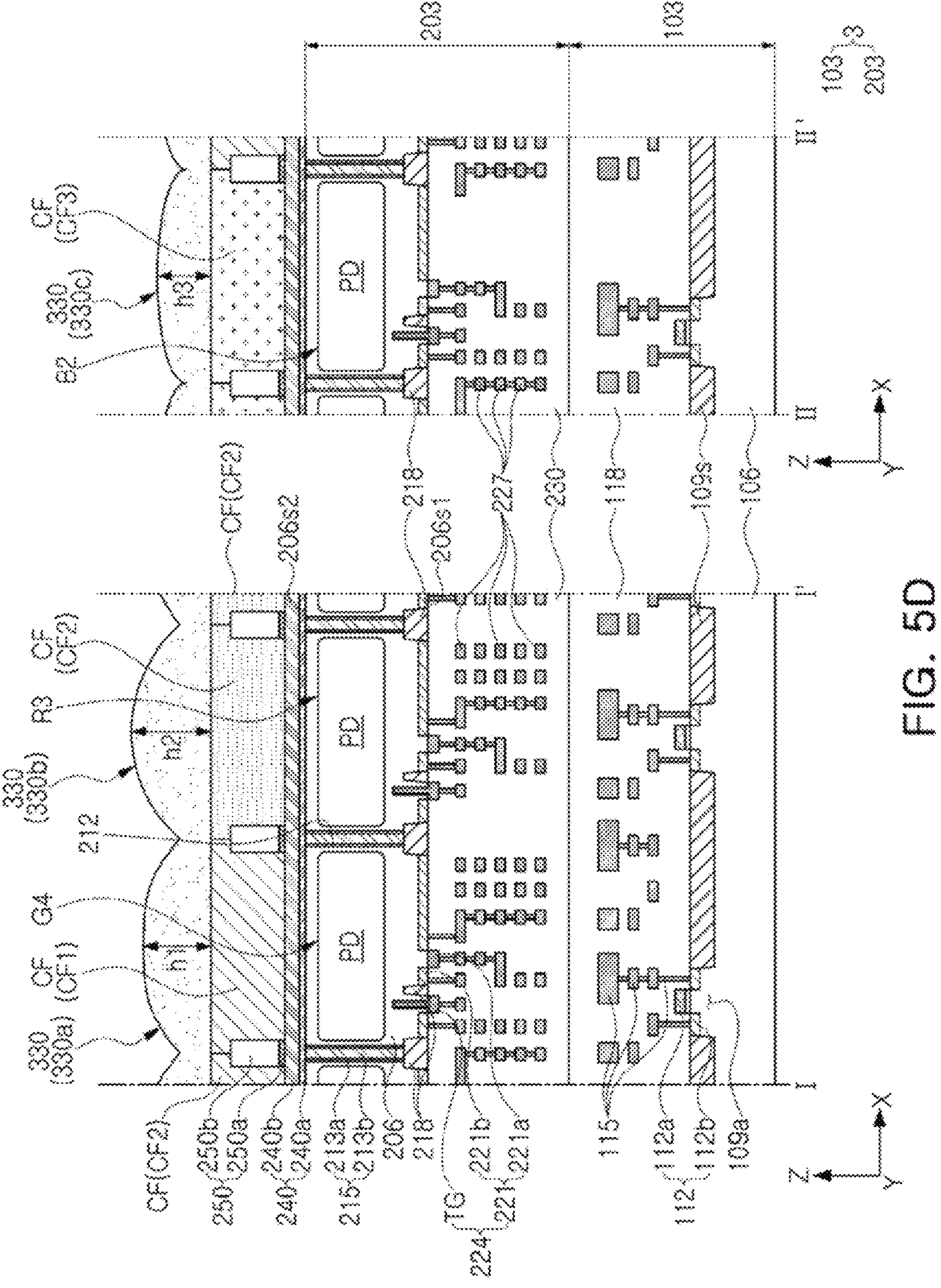

Referring to FIGS. 3, 4A, and 5D together, the preliminary lens pattern 320 may be formed as the lens patterns 330 (S50).

The lens patterns 330 may be formed by partially removing the preliminary lens pattern 320. The lens patterns 330 may be formed by performing an etching process, such as, for example, an etch-back process, on the preliminary lens pattern 320. The height of the lens patterns 330 may be adjusted using the etch-back process, and dispersion due to the internal grooves IG may be reduced.

In some example embodiments, the lens patterns 330 may include a first lens pattern 330*a* formed in the first lens region LP1, a second lens pattern 330*b* formed in the second lens region LP2, and a third lens pattern 330*c* formed in the third lens region LP3.

In some example embodiments, the first lens pattern 330*a* may vertically overlap the first color filter CF1, the second lens pattern 330*b* may vertically overlap the second color filter CF2, and the third lens pattern 330*c* may vertically overlap the third color filter CF3.

The first to third lens patterns 330*a*, 330*b*, and 330*c* may have different curvatures. This may be because the widths, depths, and/or shapes of the internal grooves IG1, IG2, and IG3 in FIG. 5B may be different. For example, the first lens pattern 330*a* may have a curvature lower than the second lens pattern 330*b* and may have a curvature higher than the third lens pattern 330*c*. This may be because the first internal groove IG1 may have a width and/or depth greater than the width and/or depth of the second internal groove IG2, and the first internal groove IG1 may have a width and/or depth less than the width and/or depth of the third internal groove IG3. As the width or depth of the internal grooves IG increases, the lens material layers 310 flowing down to the internal grooves IG during the reflow process may increase and accordingly, the curvature may decrease.

The first to third lens patterns 330*a*, 330*b*, and 330*c* may have different heights. Here, "height" may indicate the maximum height of each of the lens patterns 330 from the color filters CF. The first height h1 of the first lens pattern 330*a* may be lower than the second height h2 of the second lens pattern 330*b* and higher than the third height h3 of the third lens pattern 330*c*.

In some example embodiments, each of the lens patterns 330 may be a microlens ML.

In some example embodiments, the lens patterns 330 may vertically overlap the photoelectric conversion device region PD, but differently from the example, the lens patterns 330 may vertically overlap a plurality of photoelectric conversion device regions, that is, for example, four photoelectric conversion device regions PD.

By forming the lens patterns 330 on the first and second chip structures 103 and 203 as above, the image sensor may be manufactured.

In the description below, a method of controlling the curvature of the microlens ML by adjusting the area and/or position of the internal grooves IG will be described with reference to various modified examples of the mask pattern MP according to FIGS. 6A to 6E.

FIGS. 6A, 6B, 6C, 6D, and 6E are plan diagrams illustrating mask pattern areas for manufacturing an image sensor according to some example embodiments. The mask pattern regions MPR1, MPR2, MPR3, MPR4, and MPR5 in FIGS. 6A to 6E may be applied as at least a portion of the mask pattern MP in FIGS. 4B and 5B.

Referring to FIGS. 4B and 5B, the mask pattern MP may include an isolation opening SO and internal openings IO. In the mask pattern MP, the isolation groove SG may be formed using the isolation opening SO, and the internal grooves IG may be formed using the internal openings IO. Accordingly, on a plane, the shapes of the isolation opening SO and the internal openings IO may correspond to the isolation groove SG and the internal grooves IG. Accordingly, the description of the isolation opening SO and the internal openings IO to be described below may be similarly applied to the planar shapes of the isolation groove SG and the internal grooves IG.

Figure 6A:
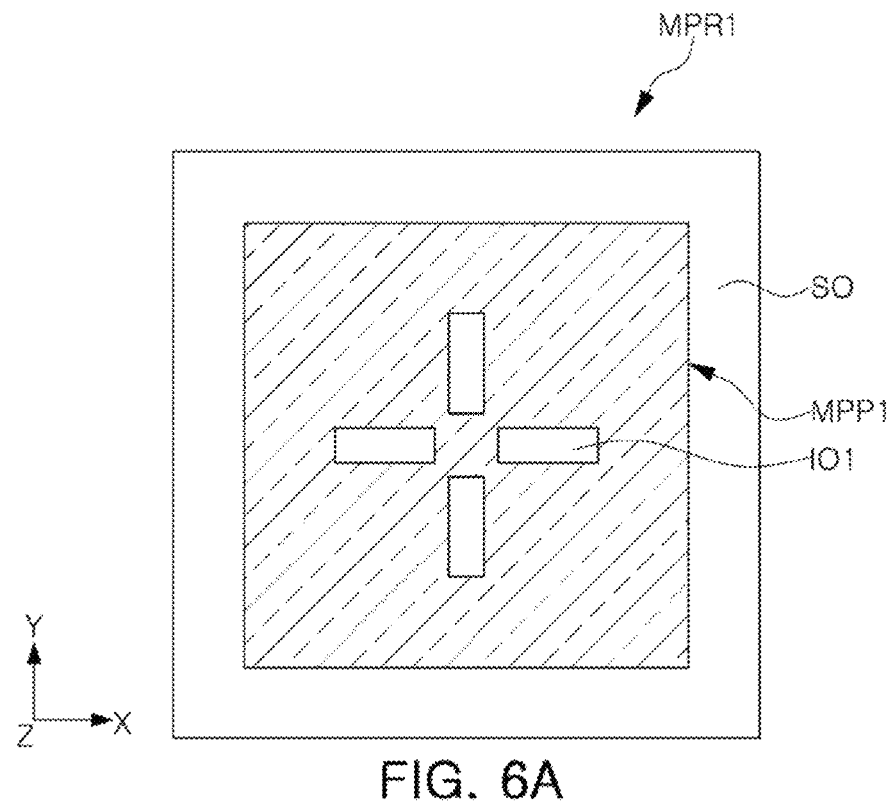
FIGS. 6A, 6B, 6C, 6D, and 6E are plan diagrams illustrating mask pattern regions for manufacturing an image sensor according to some example embodiments of the present inventive concepts.

Referring to FIG. 6A, the first mask pattern region MPR1 may include an isolation opening SO and first internal openings IO1.

In some example embodiments, a width of the isolation opening SO may be greater than a width of each of the first internal openings IO1, but some example embodiments thereof are not limited thereto. In some example embodiments, the width of each of the first internal openings IO1 may be in the range of about 1/100 to about 1/5 of the length of one side of the first mask pattern region MPR1, preferably about 1/10.

The isolation opening SO may surround the first mask pattern portion MPP1. In some example embodiments, the isolation opening SO may include openings having a line shape and extending parallel to each other in a first horizontal direction (e.g., X direction) and openings having a line shape and extending parallel to each other a second horizontal direction (e.g., a Y direction) perpendicular to the first horizontal direction. On a plane, the first mask pattern portion MPP1 may have a rectangular shape surrounded by the isolation opening SO1. However, in some example embodiments, the first mask pattern portion MPP1 may have a polygonal shape such as a hexagonal shape, and in the isolation opening SO, an internal surface of the isolation opening SO may surround the first mask pattern portion MPP1 and the external surface of the isolation opening SO may have a rectangular shape.

The first internal openings IO1 may include openings having a line shape and spaced apart from each other (e.g., isolated from direct contact with each other) and may further be spaced apart from (e.g., isolated from direct contact with) the center of the first mask pattern portion MPP1. The openings having a line shape may include a first opening having a line shape (e.g., first line shape) and extending in the first horizontal direction (X direction) from a center of the first mask pattern region MPR1, a second opening having a line shape (e.g., second line shape) and extending in a direction (−X direction) opposite to the first horizontal direction, also referred to as a first opposite direction, from the center of the first mask pattern region MPR1, a third opening having a line shape (e.g., third line shape) and extending in the second horizontal direction (Y direction) from the center of the first mask pattern region MPR1, and a fourth opening having a line shape (e.g., fourth line shape) and extending from the center of the first mask pattern region MPR1 in a direction (−Y direction) opposite to the second horizontal direction, also referred to as a second opposite direction.

As the microlens ML is formed by the first mask pattern region MPR1 including the first internal openings IO1, the curvature of the microlens ML may be relatively lowered. This may be because, referring back to FIG. 5B, the internal grooves IG formed by the internal openings IO may reduce the curvature of the lens material layer 310 in a subsequent process such as a reflow process.

As the first internal openings IO1 have the openings extending in the first and second horizontal directions, a curvature of the microlens ML formed by the first mask pattern region MPR1 in the second horizontal direction may be different from the curvatures in the other directions (e.g., other horizontal directions that are different from the first and second horizontal directions). For example, the curvatures of the microlens ML in the first and second horizontal directions may be smaller than the curvatures of the microlens ML in the other directions. This may be because the direction of forming the opening may determine the direction of the internal grooves IG which may reduce the curvature of the microlens ML by a reflow process.

Figure 6B:
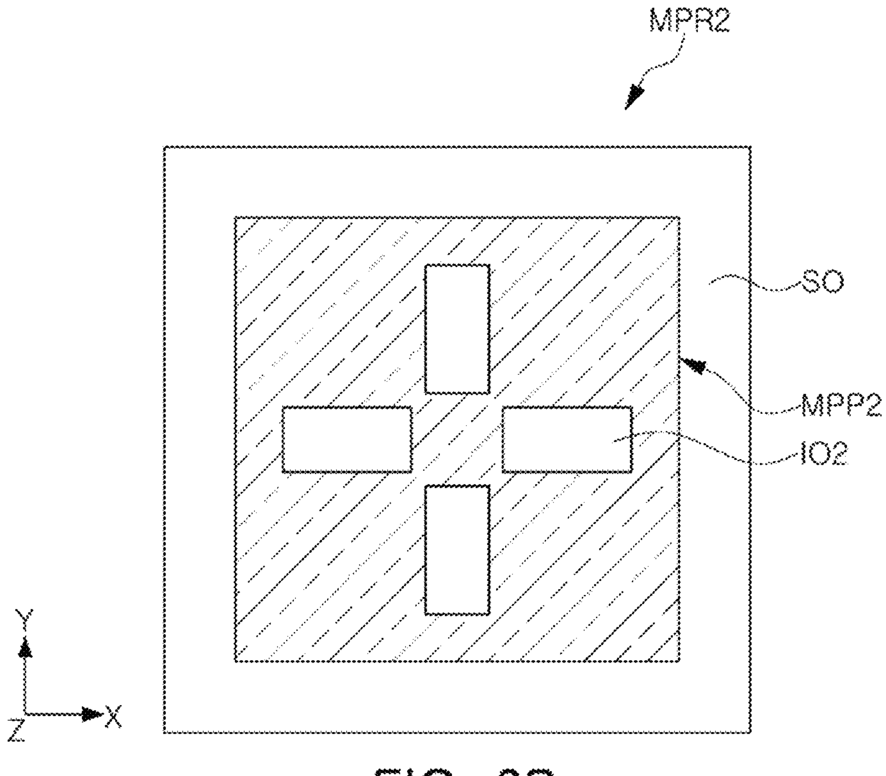

Referring to FIG. 6B, the second mask pattern region MPR2 may include an isolation opening SO and second internal openings IO2. The descriptions of the isolation opening SO may be the same as in some example embodiments, including the aforementioned example embodiments described with reference to FIG. 6A unless otherwise indicated.

The isolation opening SO may surround the second mask pattern portion MPP2.

The second internal openings IO2 may include openings having a line shape and spaced apart from each other. The openings having a line shape may include openings having a line shape and extending in the first horizontal direction from the center of the second mask pattern region MPR2 and openings having a line shape and extending in the second horizontal direction.

As the second internal openings IO2 have openings extending in the first and second horizontal directions, a curvature of the microlens ML formed by the second mask pattern region MPR2 in the first and second horizontal directions may be less than the curvature in the other direction.

The second internal openings IO2 may have a relatively large width as compared to the first internal openings IO1. A planar size of the second internal openings IO2 may be greater than that of the first internal openings IO1.

As the width of the second internal openings IO2 is relatively larger than in FIG. 6A, the width and the recess depth of the internal grooves IG (see FIG. 5B) formed by the second internal openings IO2 may further increase. Accordingly, the effect of reducing the curvature of the lens material layer 310 by the internal grooves IG in a subsequent process such as a reflow process may be relatively greater. That is, as the microlens ML is formed by the second mask pattern region MPR2 including the second internal openings IO2, curvatures of the microlens ML in the first and second horizontal directions may be controlled to be relatively lower than in FIG. 6A.

A method of controlling the curvature to be lower by configuring the second internal openings IO2 to have a width relatively larger than that of the first internal openings IO1 has been described with reference to FIG. 6B, but differently from this example, the second internal openings IO2 may be configured to have a width relatively narrower than that of the first internal openings IO1 such that the curvature may be controlled to be higher.

Figure 6C:
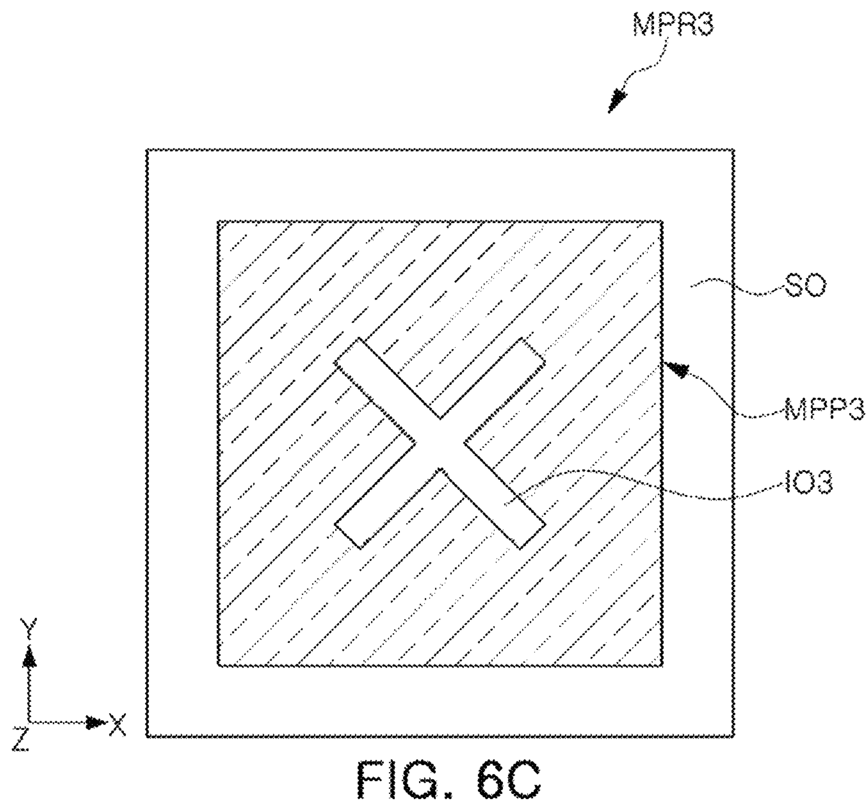

Referring to FIG. 6C, the third mask pattern region MPR3 may include an isolation opening SO and third internal openings IO3. The same descriptions described with reference to FIG. 6A may be applied to the isolation opening SO unless otherwise indicated.

The isolation opening SO may surround the third mask pattern portion MPP3.

The third internal openings IO3 may include an opening having a line shape and extending in a third horizontal direction (e.g., a direction rotated by 45 degrees from the X direction) different from the first and second horizontal directions, and an opening having a line shape extending in a fourth horizontal direction (e.g., a direction rotated by −45 degrees from the X direction) perpendicular to the third horizontal direction.

As compared to FIG. 6A, as the extending direction of the third internal openings IO3 is changed, the curvature of the microlens ML may be differently controlled. That is, as the microlens ML is formed by the third mask pattern region MPR3 including the third internal openings IO3, curvatures of the microlens ML in the third and fourth horizontal directions may be less than the curvature of the microlens ML in the other direction.

Figure 6D:
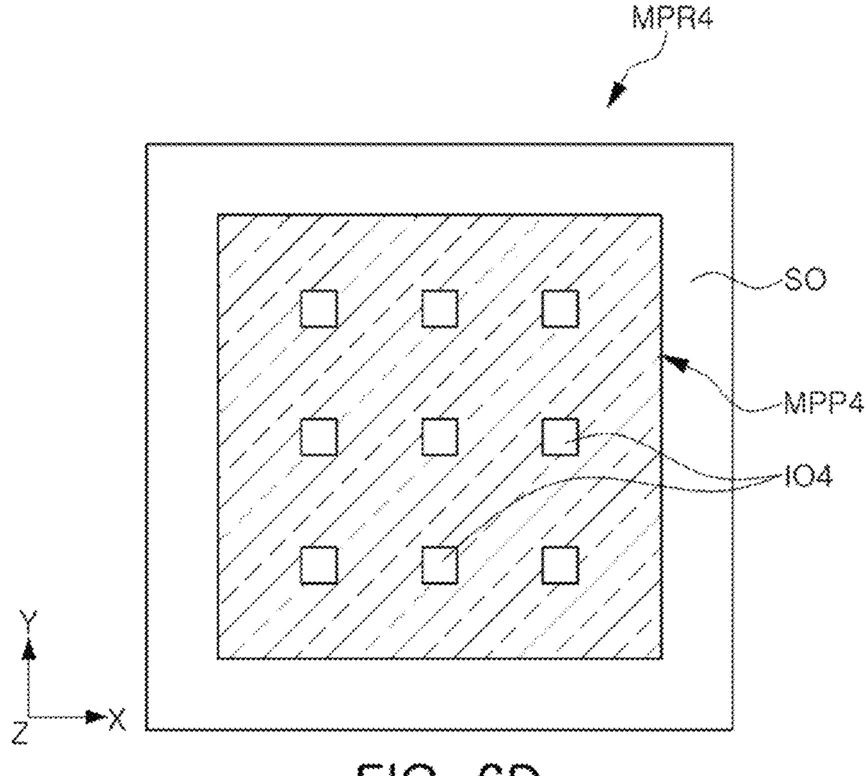

Referring to FIG. 6D, the fourth mask pattern region MPR4 may include an isolation opening SO and fourth internal openings IO4. The same descriptions described with reference to FIG. 6A may be applied to the isolation opening SO unless otherwise indicated.

The isolation opening SO may surround the fourth mask pattern portion MPP4.

The fourth internal openings IO4 may include a plurality of holes. The plurality of holes may be disposed with a predetermined distance therebetween in the fourth mask pattern region MPR4. In some example embodiments, the plurality of holes may be disposed in the same distance from the center of the fourth mask pattern region MPR4. The hole may have a rectangular shape, but some example embodiments thereof are not limited thereto and the hole may have various shapes. In some example embodiments, the number of the plurality of holes may be nine as illustrated in FIG. 6D, but the number of the plurality of holes and arrangement of the plurality of holes may be varied.

As the fourth internal openings IO4 are disposed with a predetermined distance therebetween throughout the fourth mask pattern region MPR4, the overall curvature of the microlens ML may be reduced. That is, while the curvature of the microlens ML formed by the fourth mask pattern region MPR4 in a specific direction may be controlled to not be different from the curvature in the other direction, the overall curvature of the microlens ML may be reduced.

Figure 6E:
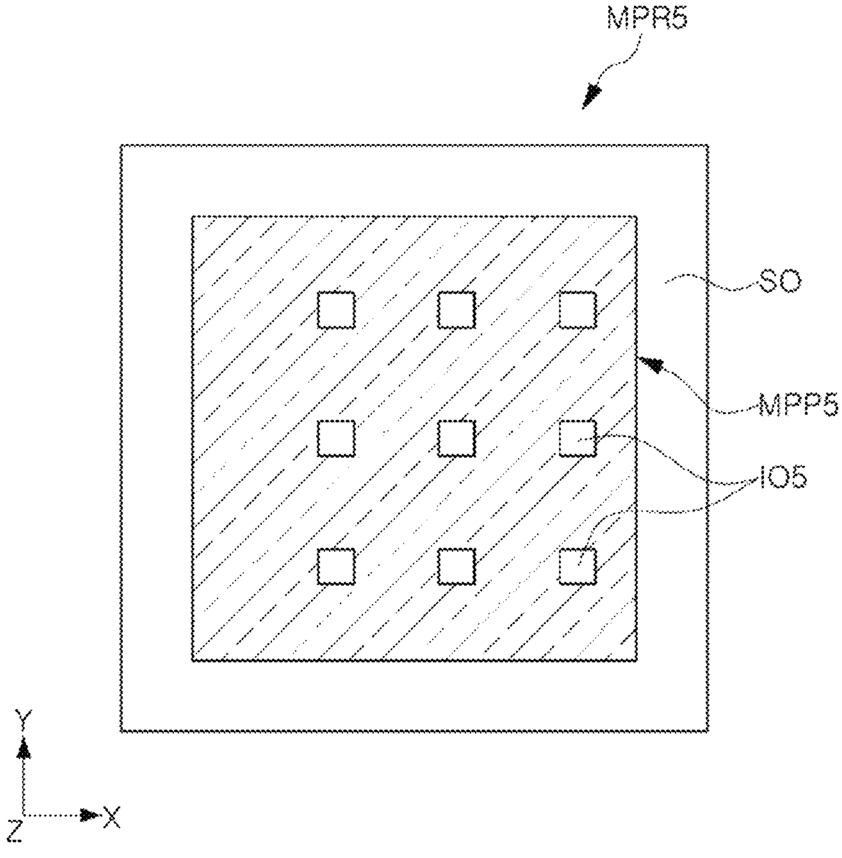

Referring to FIG. 6E, the fifth mask pattern region MPR5 may include an isolation opening SO and fifth internal openings IO5. The same descriptions described with reference to FIG. 6A may be applied to the isolation opening SO unless otherwise indicated.

The isolation opening SO may surround the fifth mask pattern portion MPP5.

The fifth internal openings IO5 may include a plurality of holes. A greater proportion of the plurality of holes may be disposed in a specific region within the fifth mask pattern region MPR5. The fifth internal openings IO5 may be asymmetrically disposed in a specific direction from the center of the fifth mask pattern region MPR5. The microlens ML formed by the fifth mask pattern region MPR5 may not have a uniform curvature in the specific direction.

In some example embodiments, the number size of the holes and/or planar size of the holes in the first horizontal region (e.g., X-direction) from the center of the fifth mask pattern region MPR5 may be greater than the number and/or planar size of the holes in the region in the direction (e.g., −X direction) opposite to the first horizontal direction. Accordingly, the curvature of the microlens ML in the first horizontal direction may not be uniform. For example, a curvature of the microlens ML in a direction opposite to the first horizontal direction may be higher than a curvature in the first horizontal direction. This may be because the internal opening reducing the curvature may be asymmetrically formed in a specific direction.

As described with reference to FIGS. 6A to 6E, as the mask pattern regions MPR1, MPR2, MPR3, MPR4, and MPR5 include the internal openings IO1, IO2, IO3, IO4, and IO5, the curvature of the lens pattern 330 (FIG. 5D) including the microlens ML or the plurality of microlenses ML may be reduced.

Also, the curvature of the microlens ML may be variously controlled by the internal openings IO1, IO2, IO3, IO4, and IO5 having various shapes.

The mask pattern MP may include the same material and may include a uniform material (e.g., a same and uniform material, which may include a single unitary piece of a material). Since the mask pattern MP may adjust the curvature of each of the plurality of microlenses ML based on patterning (e.g., only by patterning), process difficulty may improve (e.g., an image sensor may be manufactured according to a process having reduced complexity and/or reduced likelihood of defects based on the process, or method, including the utilization of the mask pattern MP) and cost associated with manufacture of an image sensor according to a method utilizing the mask pattern MP may be reduced based on the method utilizing the mask pattern.

Using the method of manufacturing an image sensor according to some example embodiments, the internal grooves IG (see FIG. 5B) may be formed by applying each of the mask pattern regions MPR1, MPR2, MPR3, MPR4, and MPR5 in FIGS. 6A to 6E or by a combination thereof, such that the curvature of the microlens ML may be controlled.

In the description below, various examples of an image sensor structure according to some example embodiments will be described with reference to FIGS. 7 to 11.

Figure 7:
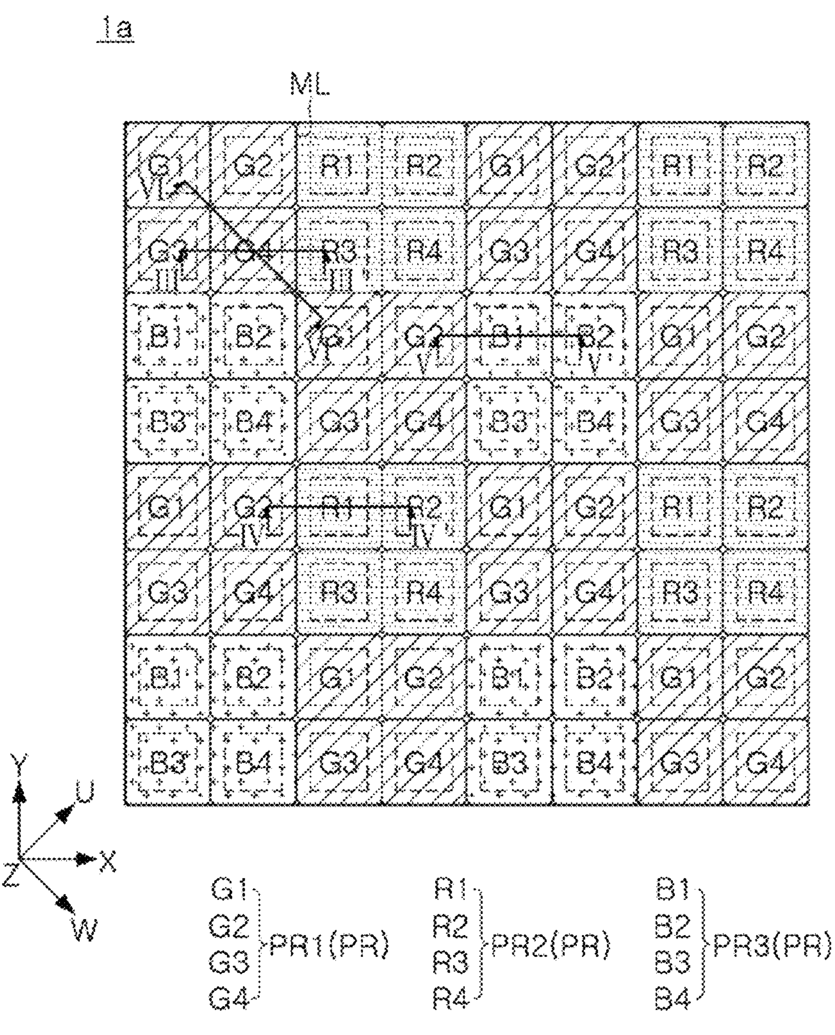
FIG. 7 is a plan diagram illustrating an image sensor according to some example embodiments of the present inventive concepts.
Figure 8:
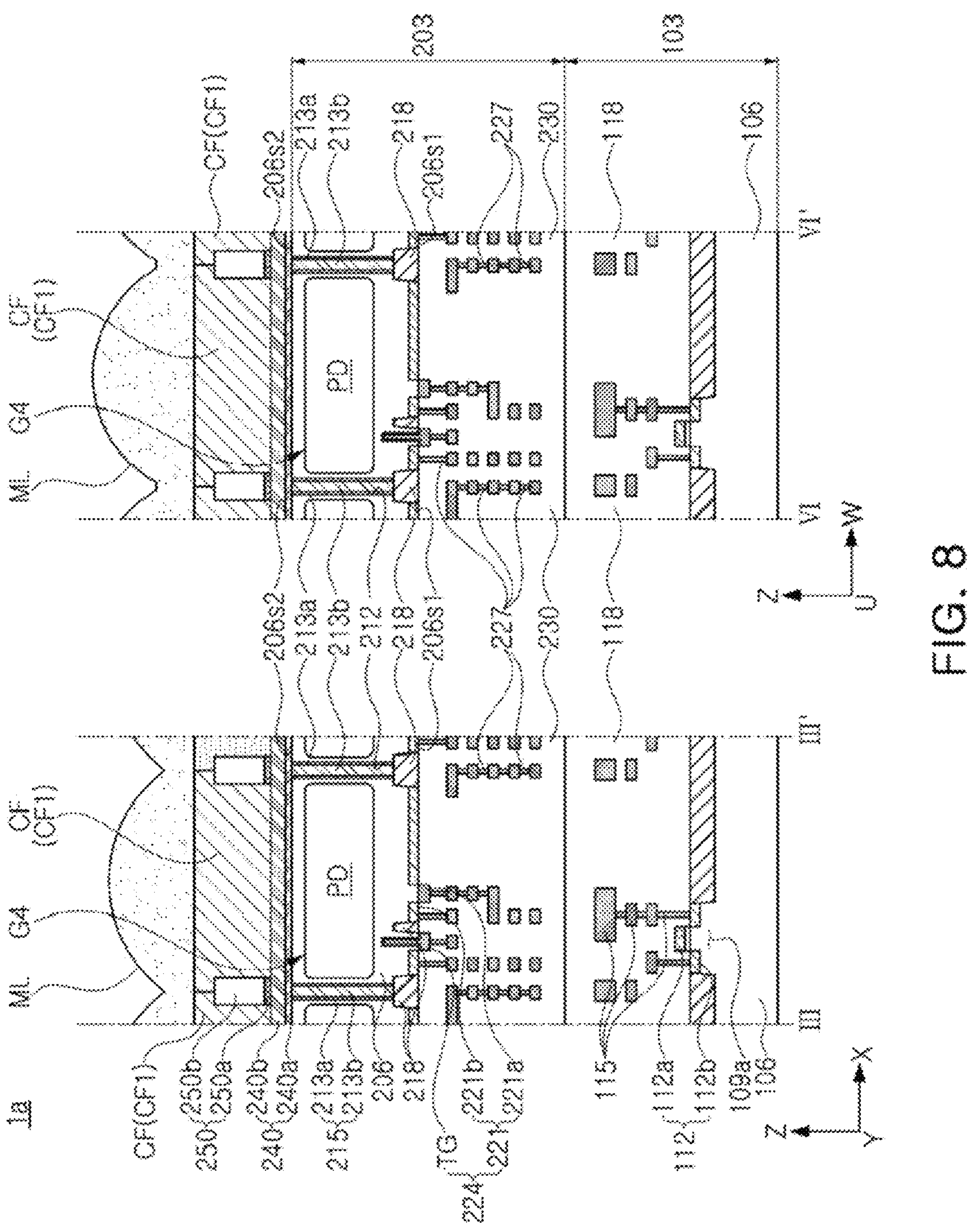
FIGS. 8, 9, 10, and 11 are cross-sectional diagrams illustrating an image sensor according to some example embodiments of the present inventive concepts.
Figure 9:
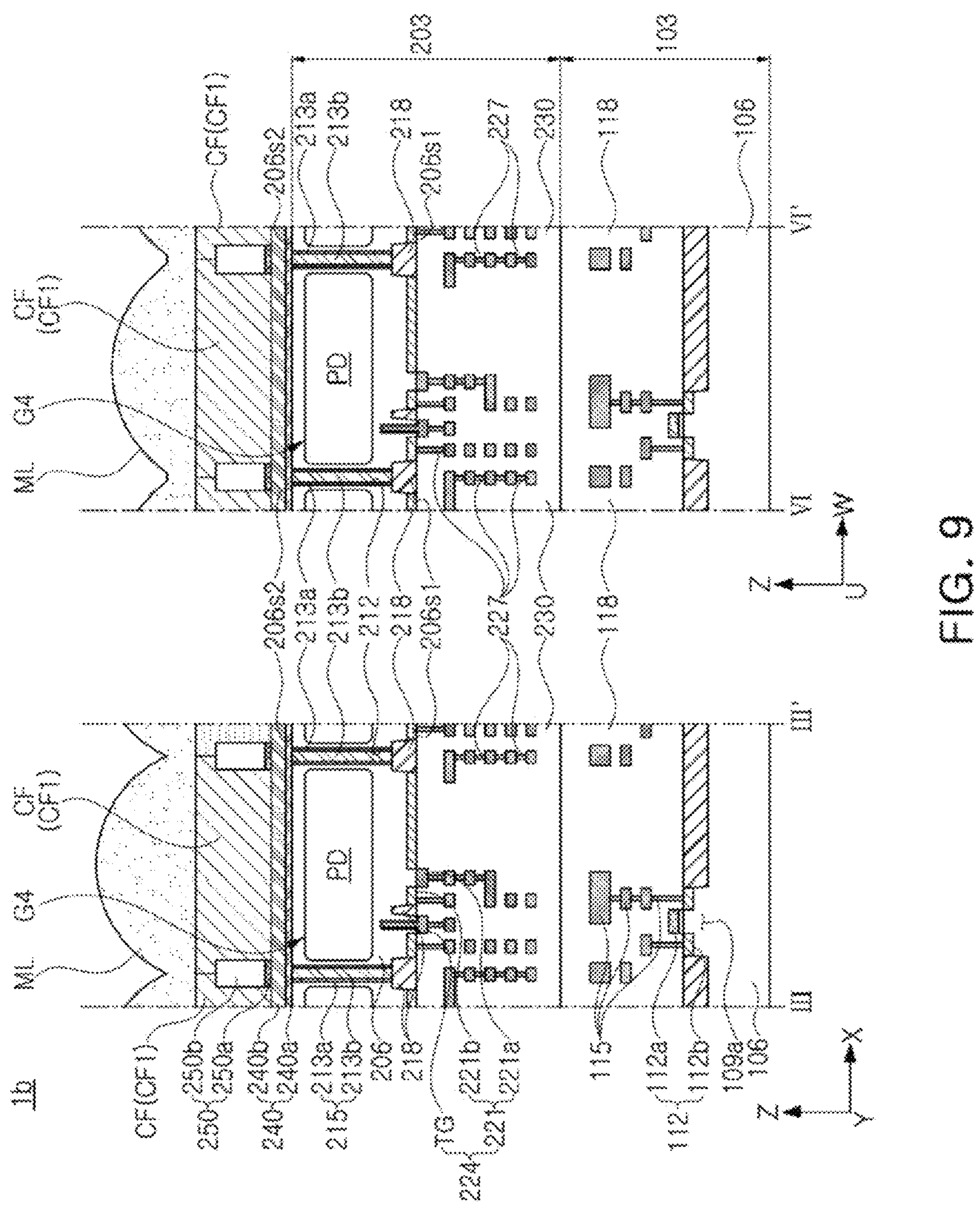
Figure 10:
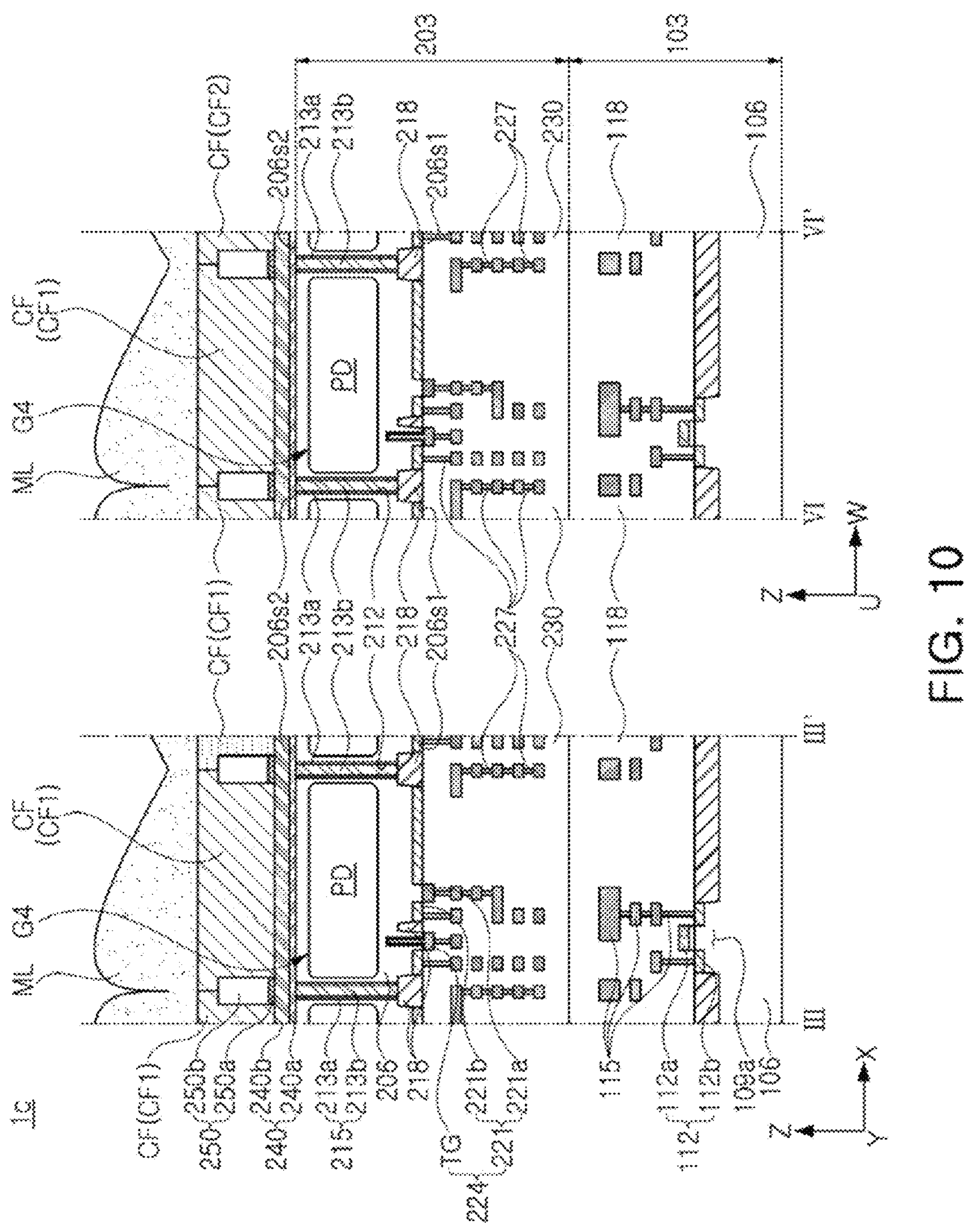
Figure 11:
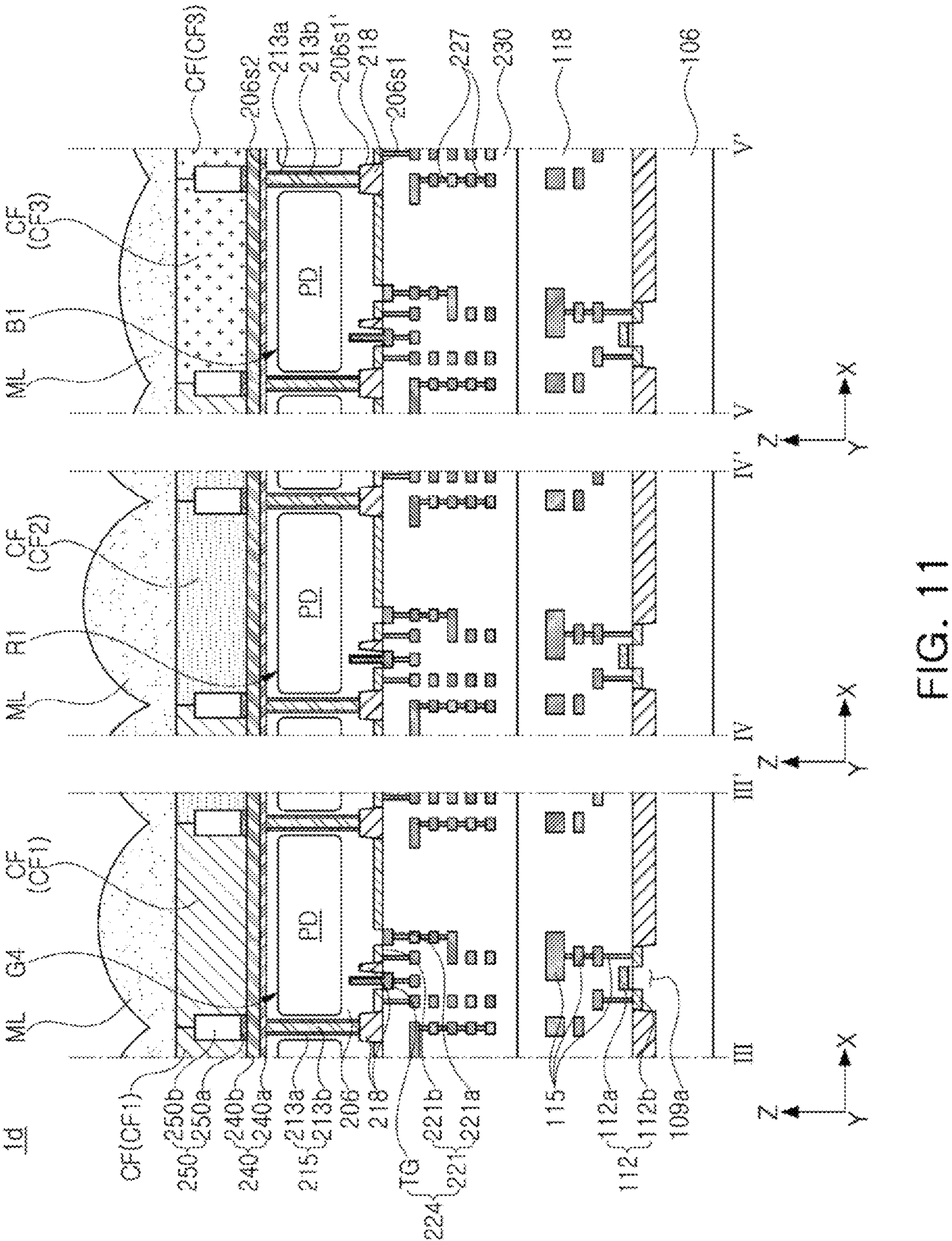

FIG. 7 is a plan diagram illustrating an image sensor according to some example embodiments. FIGS. 8, 9, 10, and 11 are cross-sectional diagrams illustrating an image sensor according to some example embodiments. FIGS. 8 to 10 are cross-sectional diagrams taken along lines III-III' and VI-VI' in FIG. 7. FIG. 11 is a cross-sectional diagram taken along lines III-III', IV-IV', and V-V' in FIG. 7.

Referring to FIGS. 7 and 8, the image sensor 1*a* according to some example embodiments may have a stack chip structure to which at least two chips are applied. For example, the image sensor 1 may include a first chip structure 103 and a second chip structure 203 on the first chip structure 103. The first chip structure 103 may be a logic chip, and the second chip structure 203 may be an image sensor chip. In some example embodiments, the first chip structure 103 may be a stack chip structure including a logic chip and a memory chip.

The first chip structure 103 may include a first substrate 106, a device isolation layer 109*s* defining an active region 109*a* on the first substrate 106, and a first circuit and a first wiring structure 115 on the first substrate 106, and a first insulating structure 118 covering the first circuit device 112 and the first wiring structure 115 on the first substrate 106.

The first substrate 106 may be a semiconductor substrate. The first substrate 106 may be a substrate formed of a semiconductor material, such as, for example, a single crystal silicon substrate. The first circuit device 112 may include a device such as a transistor including a gate 112*a* and a source/drain 112*b*.

The second chip structure 203 may include a second substrate 206, a device isolation layer 218 disposed in the second substrate 206 (e.g., in a recess 206*s*1' into the interior of the second substrate 206 from the first surface 206*s*1 as shown in FIG. 11) and defining an active region, a second circuit device 224 and a second wiring structure 227 disposed between the second substrate 206 and the first chip structure 103, and a second insulating structure 230 covering the second circuit device 224 and the second wiring structure 227 between the second substrate 206 and the first chip structure 103. The second chip structure 203 may further include photoelectric conversion devices PD and an isolation structure 215 disposed in the second substrate 206.

The second substrate 206 may have a first surface 206*s*1 and a second surface 206*s*2 opposite to the first surface 206*s*1. The first surface 206*s*1 of the second substrate 206 may oppose the first chip structure 103. The second substrate 206 may be a semiconductor substrate. The second substrate 206 may be a substrate formed of a semiconductor material, such as, for example, a single crystal silicon substrate.

The device isolation layer 218 may be disposed on the first surface 206*s*1 of the second substrate 206 and may define an active region. The device isolation layer 218 may be formed of an insulating material such as silicon oxide.

The second circuit device 224 and the second wiring structure 227 may be disposed between the first surface 206*s*1 of the second substrate 206 and the first chip structure 103.

The second circuit device 224 may include a transfer gate TG and active elements 221. The active elements 221 may be transistors including a gate 221*a* and a source/drain 221*b*. The transfer gate TG may transfer electric charges from the adjacent photoelectric conversion device PD to the adjacent floating diffusion region. The active elements 221 may be various transistors of the pixel circuit described with reference to FIGS. 2A and 2B, that is, for example, a driving transformer, a reset transistor, and a select transistor.

The transfer gate TG may be a vertical transfer gate including a portion extending into the second substrate 206 from the first surface 206*s*1 of the second substrate 206.

The second wiring structure 227 may include a plurality of wirings disposed in multiple layers, disposed on different levels, and vias for electrically connecting the plurality of wirings to each other and electrically connecting the plurality of wirings to the second circuit device 224.

The second insulating structure 230 may cover the second circuit device 224 and the second wiring structure 227 between the first surface 206*s*1 of the second substrate 206 and the first chip structure 103.

The second insulating structure 230 may be in contact with and bonded to the first insulating structure 118. Each of the first and second insulating structures 118 and 230 may be formed in multiple layers including different types of insulating layers. For example, the second insulating structure 230 may be formed in multiple layers including at least two of a silicon oxide layer, a low dielectric layer, and a silicon nitride layer.

The second chip structure 203 may further include a plurality of pixel groups PR disposed in the second substrate 206.

Each of the plurality of pixel groups PR may include at least one pixel substrate region. The plurality of pixel groups PR may be a unit of a pixel substrate region through which light of a specific wavelength passes through the same color filter.

The plurality of pixel groups PR may include a first pixel group PR1, a second pixel group PR2, and a third pixel group PR3, the first pixel group PR1 may include a plurality of pixel substrate regions G1, G2, G3, and G4, the second pixel group PR2 may include a plurality of pixel substrate regions B1, B2, B3, and B4, and the third pixel group PR3 may include a plurality of pixel substrate regions R1, R2, R3, and R4. In some example embodiments, each of the first to third pixel groups PR1, PR2, and PR3 may have four pixel substrate regions, but some example embodiments thereof are not limited thereto, and each of the first to third pixel groups PR1, PR2, and PR3 may include various number of pixel substrate regions, such as one pixel substrate region, nine pixel substrate regions, or 16 pixel substrate regions.

The plurality of pixel substrate regions G1, G2, G3, G4, B1, B2, B3, B4, R1, R2, R3, and R4 may include photoelectric conversion devices PD. For example, one of the plurality of pixel substrate regions G1, G2, G3, G4, B1, B2, B3, B4, R1, R2, R3, or R4 may include a photoelectric conversion device PD. The photoelectric conversion devices PD may generate and accumulate electric charges corresponding to incident light. The photoelectric conversion devices PD may include, for example, a photodiode, a phototransistor, a photogate, a pinned photodiode (PPD), and combinations thereof.

Each of the photoelectric conversion devices PD may be a photodiode which may be formed in the second substrate 206. Accordingly, each of the plurality of pixel substrate regions G1, G2, G3, G4, B1, B2, B3, B4, R1, R2, R3, and R4 may include a photodiode.

In some example embodiments, the plurality of pixel substrate regions G1, G2, G3, G4, B1, B2, B3, B4, R1, R2, R3, and R4 may be referred to as photoelectric conversion devices PD or photodiodes.

The isolation structure 215 may be disposed to surround each of the photoelectric conversion devices PD. The isolation structure 215 may vertically penetrate at least a portion of the second substrate 206. For example, the isolation structure 215 may vertically penetrate the second substrate 206, for example vertically extend through a trench 212 defined by one or more inner surfaces of the second substrate 206 through opposite surfaces of the second substrate 206. The isolation structure 215 may be connected to the device isolation layer 218.

The isolation structure 215 may include an isolation pattern 213*b* and an isolation insulating layer 213*a* covering a side surface of the isolation pattern 213*b*. For example, the isolation insulating layer 213*a* may include silicon oxide, and the isolation pattern 213*b* may include polysilicon. However, the number of layers forming the isolation structure 215 may be varied in some example embodiments.

The image sensor 1*a* may further include an insulating structure 240 disposed on the second surface 206*s*2 of the second substrate 206. The insulating structure 240 may cover the isolation structure 215.

The insulating structure 240 may include an anti-reflection layer which may prevent reflection of light caused by a sudden change in refractive index on the second surface 206*s*2 of the second substrate 206, which may be formed of silicon. The insulating structure 240 may include an anti-reflection layer for providing incident light to travel to the photoelectric conversion devices PD with high transmittance by adjusting a refractive index. The insulating structure 240 may also be referred to as an anti-reflection structure or an anti-reflection layer.

The insulating structure 240 may include a lower layer 240*a* and an upper layer 240*b* on the lower layer 240*a* stacked in sequence. The lower layer 240*a* may be in contact with the second surface 206*s*2 of the second substrate 206, may have transmittance at visible wavelengths, and may include a material having a negative charge for preventing charge due to a dangling bond of the second surface 206*s*2 of the second substrate 206. The upper layer 240*b* may include a first upper material layer having transmittance at a visible wavelength and able to control a peak of transmittance by adjusting a thickness, and a second upper material layer having transmittance at a visible wavelength and may be passivable. The lower layer 240*a* may include a high-k dielectric, such as, for example, aluminum oxide. The upper layer 240*b* may include at least one high dielectric layer and at least one silicon oxide layer.

The image sensor 1*a* may further include a grid structure 250 on the insulating structure 240. The grid structure 250 may include a first layer 250*a* and a second layer 250*b* stacked in sequence. The thickness of the second layer 250*b* may be greater than the thickness of the first layer 250*a*. The first layer 250*a* may include a first material, and the second layer 250*b* may include a second material different from the first material.

In some example embodiments, the first material may include a conductive material, such as, for example, a metal such as Ti, Ta, or W, or a metal nitride such as TiN or TaN.

In some example embodiments, the second material may include an insulating material. The insulating material may include a low refractive index (LRI) material, such as, for example, an oxide or nitride including Si, Al, or a combination thereof, silicon oxide having a porous structure, or silica nanoparticles having a network structure.

However, in some example embodiments, the structure, the number of layers, and materials of the grid structure 250 may be varied.

The image sensor 1*a* may further include color filters CF. The color filters CF may include color filters CF1, CF2, and CF3 of different colors. For example, the color filters CF may include first to third color filters CF1, CF2, and CF3, the first color filter CF1 may be a green color filter configured to selectively transmit green light, the second color filter CF2 may be a red color filter configured to selectively transmit red light, and the third color filter CF3 may be a blue color filter configured to selectively transmit blue light.

The color filters CF may be disposed on the insulating structure 240. The color filters CF may allow light of a specific wavelength to pass and to reach the photoelectric conversion devices PD. For example, the color filters CF may be formed of a material in which a pigment including a metal or a metal oxide is mixed with a resin. A thickness of each of the color filters CF may be greater than a thickness of the grid structure 250. The color filters CF may cover the grid structure 250 on the insulating structure 240. The color filters CF may cover side surfaces and upper surfaces of the grid structure 250 on the insulating structure 240.

The color filters CF may vertically overlap the plurality of pixel groups PR, respectively. For example, the first to fourth pixel substrate regions G1, G2, G3, and G4 of the first pixel group PR1 may be perpendicular to the first color filter CF1 of one of the color filters CF.

The image sensor 1*a* may further include microlenses ML on the color filters CF.

The microlenses ML may vertically overlap the color filters CF. In some example embodiments, one of the microlenses ML may be disposed on one pixel substrate region.

Each of the microlenses ML may have a convex shape in a direction of being further away from the first chip structure 103. The microlenses ML may condense incident light into the photoelectric conversion devices PD. The microlenses ML may be formed of a transparent photoresist material or a transparent thermosetting resin material. For example, the microlenses ML may be formed of a TMR-based resin (manufactured by Tokyo Ohka Kogo, Co.) or an MFR-based resin (manufactured by Japan Synthetic Rubber Corporation), but some example embodiments thereof are not limited thereto.

A portion of the microlenses ML, that is, for example, the first microlenses ML1 may have different curvatures in different directions. For example, a curvature of the first microlens ML1 in a first horizontal direction (e.g., X direction) may be different from a curvature in a second horizontal direction (e.g., the W direction, rotated by −45 degrees from the X direction) intersecting the first horizontal direction. In some example embodiments, a curvature in the first horizontal direction may be lower than a curvature in the second horizontal direction. This may be because the first microlens ML1 may be formed using the first mask pattern region MPR1 in FIG. 6A. As the first mask pattern region MPR1 includes the first internal openings IO1 having a line shape extending in the X and Y directions, the curvature in the X and Y directions may be lower than the curvature in the other directions.

Furthermore, when the first microlens ML1 is formed using the second mask pattern region MPR2 in FIG. 6B, the curvature in the first horizontal direction may be relatively lower.

In the description below, various modified examples of the above-described components of the image sensor will be described. In the various modified examples of the components of the image sensor to be described below, modified or replaced components will be mainly described. Also, although modified or replaced components described below are described with reference to respective drawings, the modified components may be combined with each other and may form an image sensor according to some example embodiments.

Referring to FIG. 9, an image sensor 1*b* according to some example embodiments may include a microlens ML structure different from the example in FIG. 8.

A portion of the microlenses ML, that is, for example, the first microlenses ML1 may have different curvatures in different directions. A curvature of the first microlens ML1 in a first horizontal direction (e.g., X direction) may be different from a curvature in a second horizontal direction (e.g., the W direction, rotated by −45 degrees from the X direction) intersecting the first horizontal direction. However, differently from the image sensor 1*a* in FIG. 8, in the first microlens ML1 of the image sensor 1*b* according to some example embodiments, the curvature in the first horizontal direction may be higher than the curvature in the second horizontal direction. This may be because the first microlens ML1 is formed using the third mask pattern region MPR3 in FIG. 6C. As the third mask pattern region MPR3 includes the third internal openings IO3 having a line shape and extending in the second horizontal direction, the curvature in the second horizontal direction may be lower than the curvature in the other direction.

However, in some example embodiments, when the first microlens ML1 is formed using the fourth mask pattern region MPR4 in FIG. 6D, the curvature of the first microlens ML1 in the first horizontal direction may be the same as the curvature in the second horizontal direction.

Referring to FIG. 10, an image sensor 1*c* according to some example embodiments may include a microlens ML structure different from the example in FIG. 8.

A portion of the microlenses ML, that is, for example, the first microlenses ML1 may have a non-uniform curvature in the first horizontal direction or the second horizontal direction. That is, the first microlens ML1 may have a convex shape by being inclined in one direction from one horizontal direction. This may be because the first microlens ML1 is formed using the fifth mask pattern region MPR5 in FIG. 6E. As the fifth mask pattern region MPR5 includes the fifth internal openings IO5 which may be asymmetric internal openings in one horizontal direction, a microlens having non-uniform curvature in one direction may be formed.

Referring to FIG. 11, an image sensor 1*d* according to some example embodiments may include a structure of microlenses ML different from the example in FIG. 8.

The microlenses ML may include first to third microlenses ML1, ML2, and ML3. In some example embodiments, each of the first to third microlenses ML1, ML2, and ML3 may be microlenses formed on different color filters CF1, CF2, and CF3.

The first to third microlenses ML1, ML2, and ML3 may have different curvatures. This may be because, referring to FIGS. 6A and 6B together, the first to third microlenses ML1, ML2, and ML3 are formed by controlling the curvatures using the internal openings having different planar areas.

As the first to third microlenses ML1, ML2, and ML3 have different curvatures, although the wavelengths of the light collected by the color filters CF1, CF2, CF3 are different, by adjusting the curvature in consideration of the focal length, an image sensor having improved performance may be provided. Accordingly, manufacturing an image sensor according to some example embodiments to provide an image according to methods according to some example embodiments, including methods that include forming microlenses ML including for example the first to third microlenses ML1, ML2, and ML3 on color filters including for example the color filters CF1, CF2, CF3 may result in manufacturing an image sensor having improved image sensing performance based on the curvatures of the microlenses corresponding to the respective wavelength regions of light that the respective underlying color filters are configured to selectively transmit.

In the description below, various examples of an image sensor structure according to some example embodiments will be described with reference to FIGS. 12 to 16.

Figure 12:
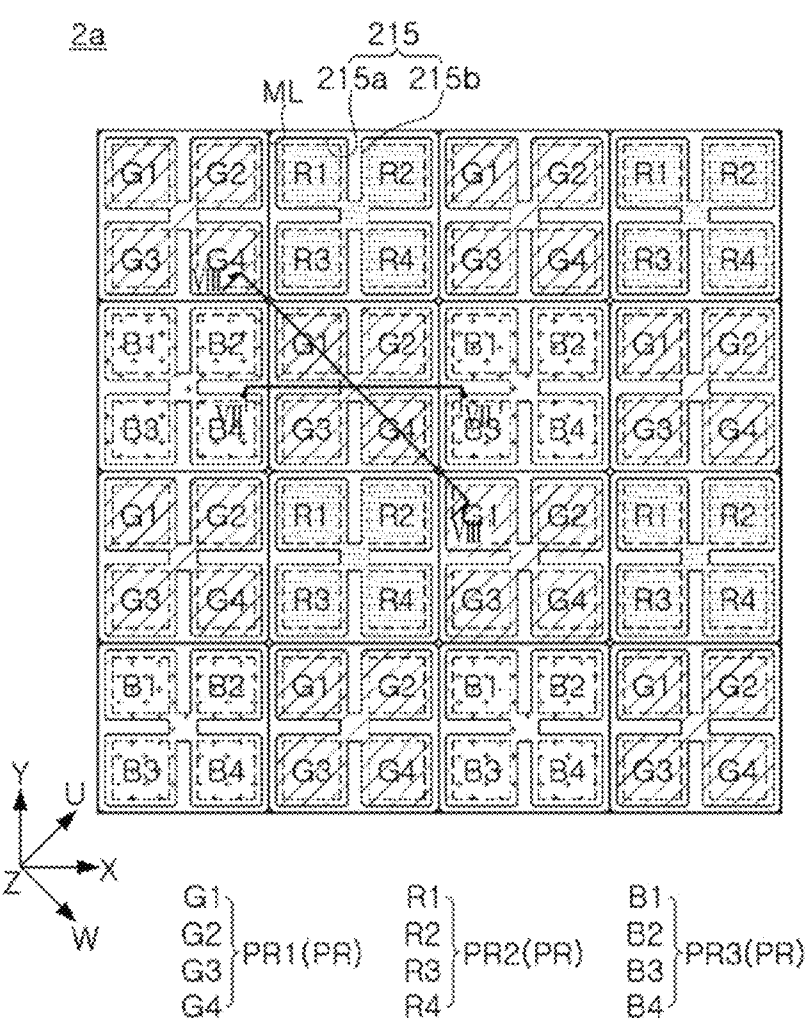
FIG. 12 is a plan diagram illustrating an image sensor according to some example embodiments of the present inventive concepts.

FIG. 12 is a plan diagram illustrating an image sensor according to some example embodiments. FIGS. 13, 14, 15, and 16 are cross-sectional diagrams illustrating an image sensor according to some example embodiments. FIGS. 13 to 16 are cross-sectional diagrams taken along lines VII-VII' and VIII-VIII' in FIG. 12.

Figure 13:
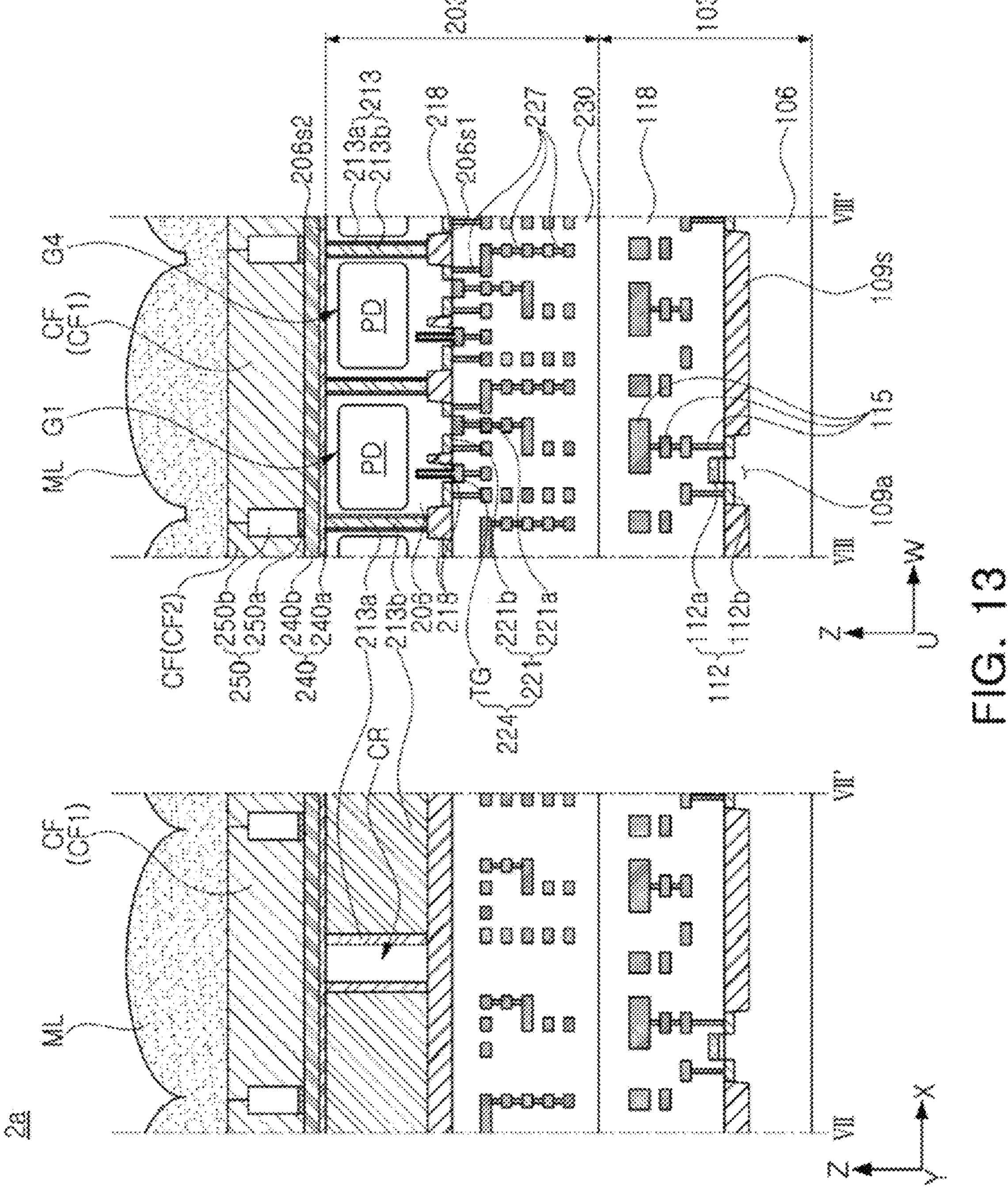
FIGS. 13, 14, 15, and 16 are cross-sectional diagrams illustrating an image sensor according to some example embodiments of the present inventive concepts.

Referring to FIGS. 12 and 13, an image sensor 2*a* according to some example embodiments may include an isolation structure 215, a grid structure 250, and microlenses ML different from the examples in FIG. 7.

The second chip structure 203 may further include a plurality of pixel groups PG disposed in the second substrate 206. Each of the plurality of pixel groups PR may include at least one pixel substrate region. The plurality of pixel groups PR may be a unit of a pixel substrate region through which light of a specific wavelength passes through the same color filter.

The plurality of pixel groups PR may include a first pixel group PR1, a second pixel group PR2, and a third pixel group PR3. In some example embodiments, each of the first to third pixel groups PR1, PR2, and PR3 may include a plurality of pixel substrate regions, such as, for example, four pixel substrate regions.

As illustrated in FIG. 12, the isolation structure 215 may include a line portion 215*a* surrounding each of the pixel groups PR and extension portions 215*b* extending from the line portion 215*a* to regions between the plurality of pixel substrate regions G1, G2, G3, G4, B1, B2, B3, B4, R1, R2, R3, R4 of each of the pixel groups PR. The extension portions 215*b* may have end portions spaced apart from each other in each of the pixel groups PR.

In some example embodiments, the isolation pattern 213*b* may be disposed in the isolation portion 215*a* and may extend into the extension portions 215*b*.

Each of the pixel groups PR, for example, the first pixel group PR1 may include a plurality of pixel regions G1, G2, G3, and G4. The first and second pixel substrate regions G1 and G2 may be adjacent to each other in the first direction X, the third and fourth pixel substrate regions G3 and G4 may be adjacent to each other in the first direction X, the first and third pixel substrate regions G1 and G3 may be adjacent to each other in a second direction Y perpendicular to the first direction X, and the second and fourth pixel substrate regions G1 and G4 may be adjacent to each other in a second direction Y perpendicular to the first direction X. Accordingly, the first to fourth pixel substrate regions G1, G2, G3, and G4 may be disposed in sequence in a clockwise direction. A region in the second substrate 206 disposed between the first to fourth pixel substrate regions G1, G2, G3, and G4 may be defined as an "intermediate substrate region CR."

The grid structure 250 may be disposed between filters of different colors among the color filters CF. For example, the grid structure 250 may be disposed between a first color filter CF1 having a first color and a second color filter CF2 having a second color different from the first color. That is, the grid structure 250 may not be disposed between the color filters CF of the same color.

In some example embodiments, the grid structure 250 may vertically overlap the line portions 215*a* of the isolation structure 215. The grid structure 250 may have a width different from that of the line portions 215*a* of the isolation structure 215. For example, the width of the grid structure 250 may be greater than the width of each of the line portions 215*a* of the isolation structure 215.

The microlenses ML may be disposed on the first pixel group PR1, the second pixel group PR2, and the third pixel group PR3, respectively. The microlenses ML may include a first microlens ML1 disposed on the first pixel group PR1. The first microlens ML1 may overlap the plurality of photoelectric conversion device regions PD in the Z-direction, differently from described with reference to FIGS. 7 to 11. In this case, since the plurality of photoelectric conversion device regions PD may share one microlens, the autofocus capability of the image sensor may improve.

When the curvature of the first microlens ML1 is high, light may be well collected at a specific focal length. Accordingly, the autofocus ability may improve by increasing the curvature of the first microlens ML1. However, in some example embodiments in which one microlens shares a plurality of photoelectric conversion devices PD, in the image sensor 2*a*, as the curvature of the first microlens ML1 increases, sensitivity may decrease due to loss of collected light by the isolation structure 215. Accordingly, the curvature of the first microlens ML1 may be controlled using the method of manufacturing an image sensor (see FIGS. 3 to 5D) and mask pattern regions (see FIGS. 6A to 6E) used therein according to some example embodiments, such that the first microlens ML1 having an improved or optimized curvature may be formed, for example based on a method of manufacturing an image sensor including forming lens patterns using a lens material layer in which the isolation groove and the internal grooves are formed. An image sensor having improved autofocus capability and sensitivity through the first microlens ML1 having the improved or optimized curvature may be provided. Accordingly, a method of manufacturing an image sensor that includes forming lens patterns using the lens material layer in which the isolation groove and the internal grooves are formed may enable improved control of the curvatures of the lens patterns being formed such that the curvatures may be improved or optimized to provide improved or optimized autofocus capability and/or sensitivity of the image sensor and thus may provide an image sensor having improved image sensing performance. Additionally, based on the method including forming lens patterns using the lens material layer in which the isolation groove and the internal grooves, a complexity and/or cost of the process for manufacturing the image sensor may be reduced, thereby improving ease of manufacture of improved-performing image sensors with reduced likelihood of defects in the process due to the reduced complexity and/or cost of the process.

In some example embodiments, as the first microlens ML1 is formed using the fourth mask pattern region MPR4 in FIG. 6D, for example, the first microlens ML1 may have a constant curvature in overall directions.

Figure 14:
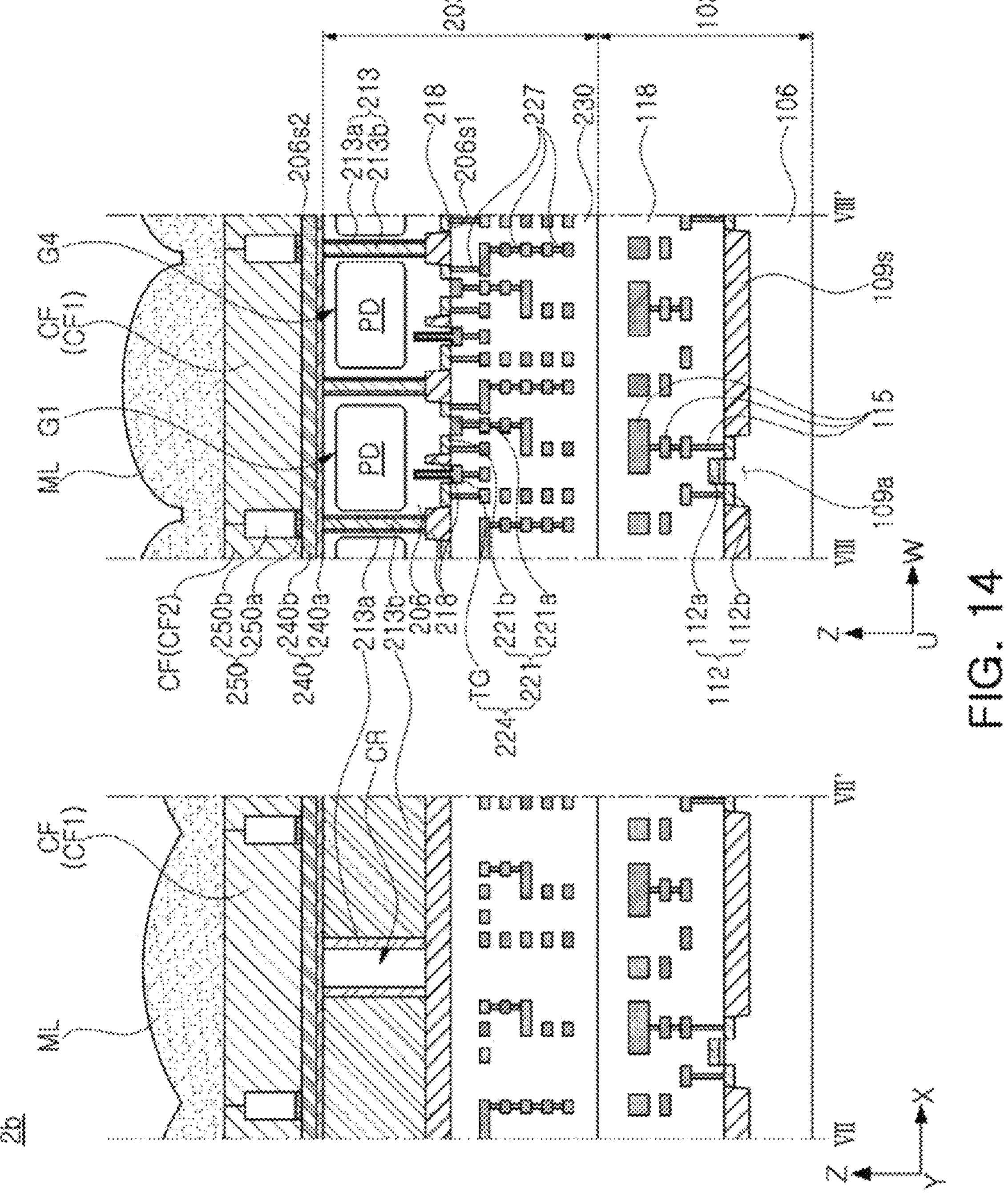

Referring to FIG. 14, the image sensor 2*b* may include a structure of a first microlens ML1 different from that of the image sensor 2*a* in FIG. 13.

In some example embodiments, a curvature of the first microlens ML1 in the first horizontal direction (e.g., the X direction) may be lower than a curvature in the other horizontal direction using the first mask pattern region MPR1 in FIG. 6A, for example.

Furthermore, as described with reference to FIGS. 10 and 11, the first microlens ML1 may be formed to have a non-uniform curvature in the first horizontal direction or to have a curvature different from that of the other microlenses.

Figure 15:
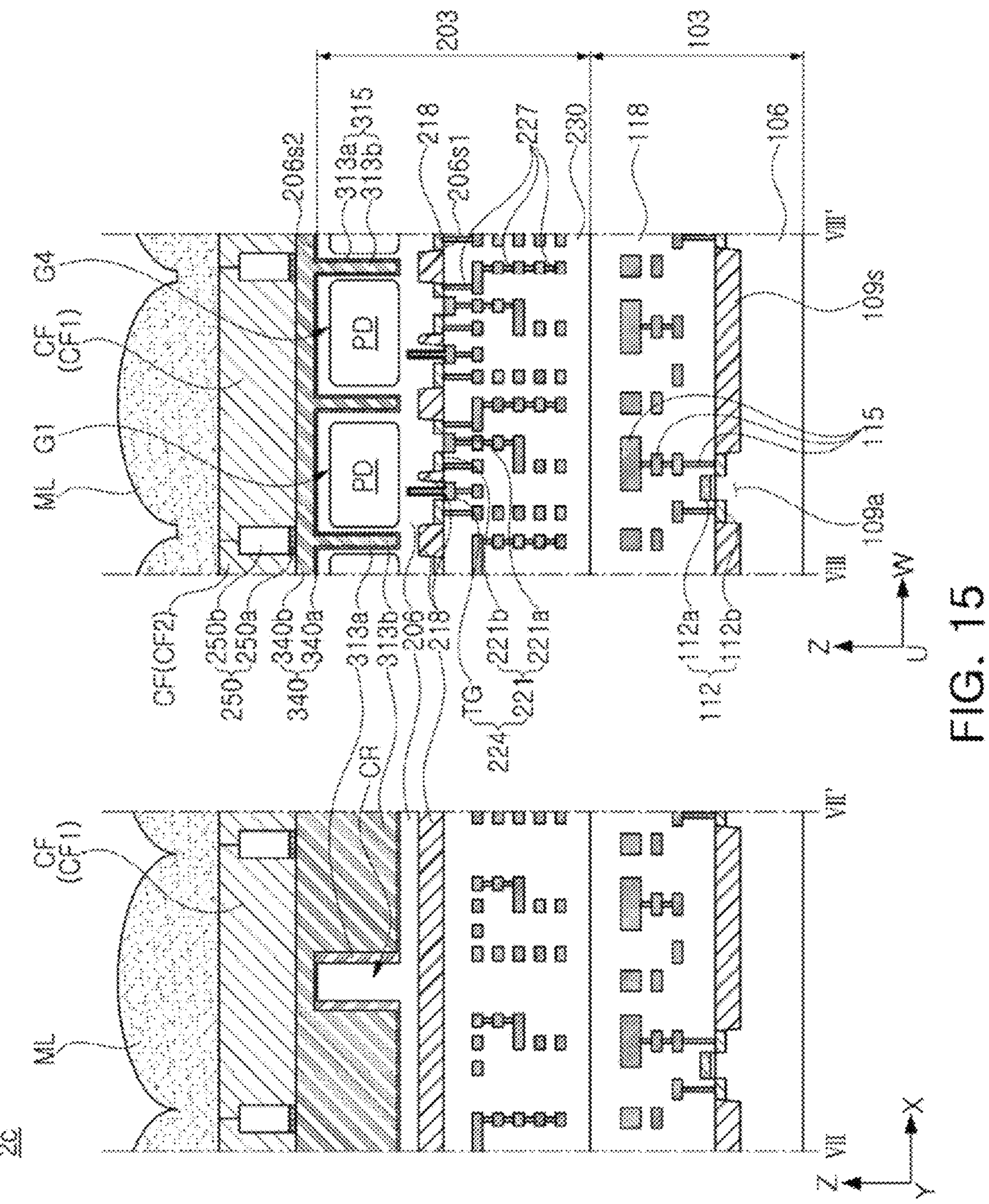

Referring to FIG. 15, the image sensor 2*c* may have an isolation structure 315 structure different from that of the image sensor 2*a* in FIG. 13.

The above-described isolation structure 215 (in FIG. 13) may be replaced with an isolation structure 315 extending in a direction from the second surface 206*s*2 of the second substrate 206 toward the first surface 206*s*1 of the second substrate 206. The isolation structure 315 may be spaced apart from the first surface 206*s*1 of the second substrate 206. The isolation structure 315 may be spaced apart from the device isolation layer 218.

The above-described insulating structure 240 (in FIG. 13) may be transformed into the insulating structure 340 including substantially the same material as that of the isolation structure 315. For example, the insulating structure 340 may include a lower layer 340*a* and an upper layer 340*b* on the lower layer 340*a*, and at least a portion of the lower layer 340*a* and the upper layer 340*b* may extend into the second substrate 206 and may form the material of the isolation structure 315. For example, the isolation structure 315 may include a first layer 313*a* extending from a lower layer 340*a* and a second layer 313*b* extending from an upper layer 340*b*. The first layer 313*a* may be interposed between the second layer 313*b* and the second substrate 206. Accordingly, at least a portion of the isolation structure 315 may be formed to extend from at least a portion of the insulating structure 340, that is, the anti-reflection layer.

Figure 16:
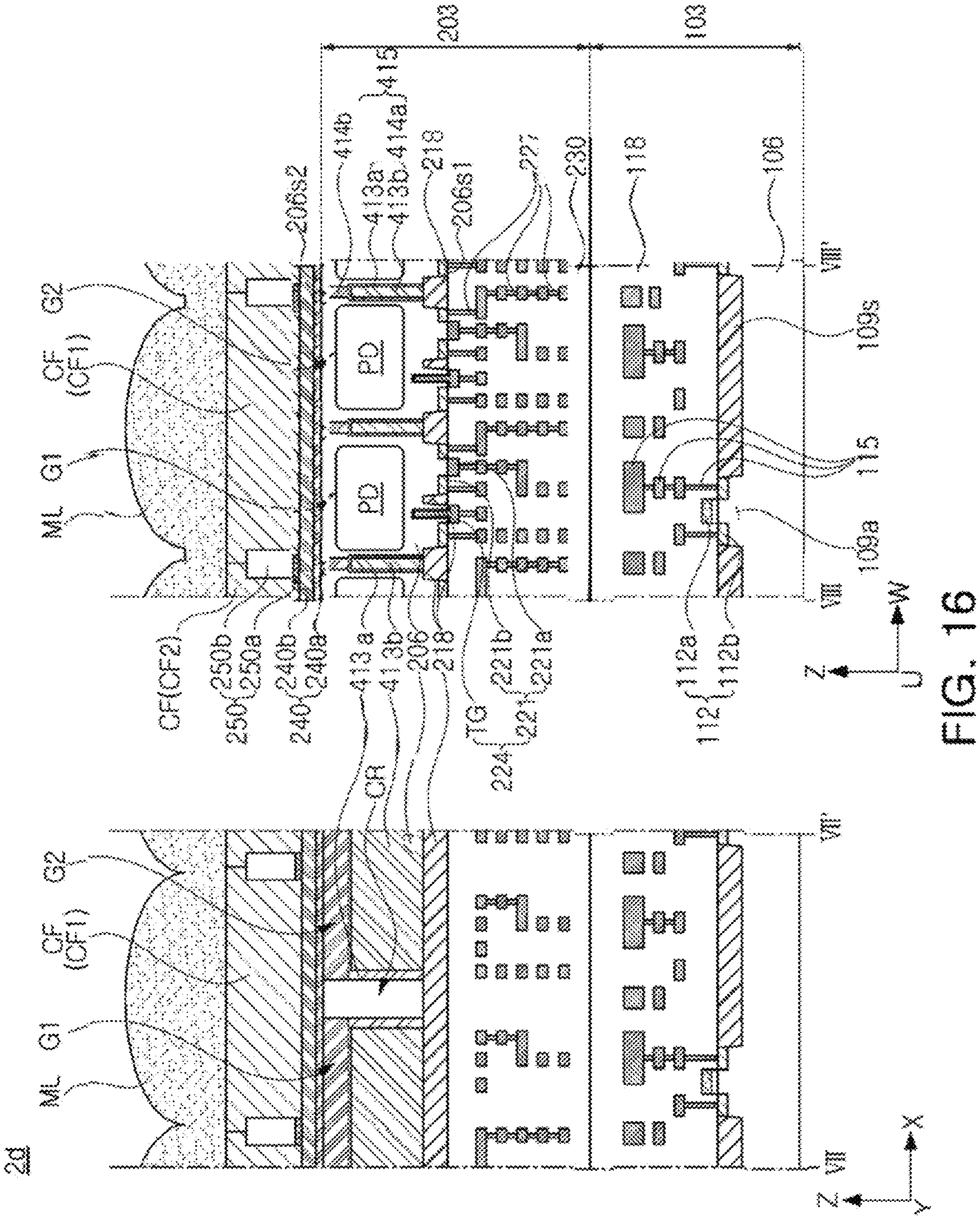

Referring to FIG. 16, the image sensor 2*d* may have a structure of an isolation structure 415 different from that of the image sensor 2*a* in FIG. 13.

Referring to FIG. 16, the above-described isolation structure 215 (in FIG. 5) may be modified into an isolation structure 415 including a lower isolation region 414*a* and an upper isolation region 414*b* on the lower isolation region 414*a*.

The lower isolation region 414*a* may extend from the device isolation layer 218 on the first surface 206*s*1 of the second substrate 206 toward the second surface 206*s*2 of the second substrate 206. The upper isolation region 414*b* may extend from the second surface 206*s*2 of the second substrate 206 toward the first surface 206*s*1 of the second substrate 206.

The lower isolation region 414*a* may include a lower isolation pattern 413*b* and a lower isolation insulating layer 413*a* disposed between the lower isolation pattern 413*b* and the second substrate 206. The lower isolation pattern 413*b* may be formed of polysilicon, and the lower isolation insulating layer 413*a* may be formed of silicon oxide. The upper isolation region 414*b* may be formed of an insulating material. For example, the upper isolation region 414*b* may include at least one of silicon oxide or a high dielectric.

The lower isolation region 414*a* may improve dark current properties of the image sensor 2*d*, and the upper isolation region 414*b* may prevent cross talk of the image sensor 2*d*. Accordingly, the isolation structure 415 may improve signal noise of the image sensor 2*d*, thereby increasing resolution of the image sensor 2*d*.

The upper isolation region 414*b* may be in contact with the lower isolation region 414*a*, but some example embodiments thereof are not limited thereto and the upper isolation region 414*b* and the lower isolation region 414*a* may be spaced apart from each other in some example embodiments.

According to the aforementioned example embodiments, by providing a microlens having an improved or optimized curvature using a mask pattern including internal openings patterned in various shapes, an image sensor having improved autofocus capability and sensitivity may be provided.

As the curvature of the microlens may be controlled based on patterning for a mask pattern, for example controlled only by patterning for a mask pattern (e.g., photomask pattern), for example a mask pattern having the same and uniform material, manufacturing costs of the image sensor may be reduced.

While some example embodiments have been illustrated and described above, it will be configured as apparent to those skilled in the art that modified examples and variations could be made without departing from the scope of the present inventive concepts as defined by the appended claims.

What is claimed is:

1. A method of manufacturing an image sensor, the method comprising:

forming a first chip structure including a circuit wiring structure;

forming a second chip structure on the first chip structure, the second chip structure including a plurality of photoelectric conversion device regions;

forming a lens material layer on the second chip structure;

forming:

an isolation groove in the lens material layer, wherein the isolation groove defines a plurality of lens regions in the lens material layer, and internal grooves in the plurality of lens regions of the lens material layer, wherein the plurality of lens regions are surrounded by the isolation groove, and wherein the internal grooves terminate above a level where the lens material layer is in contact with a layer underlying the lens material layer; and forming lens patterns using the lens material layer, wherein the plurality of lens regions includes a first lens region, wherein the internal grooves include a first internal groove in the first lens region, and wherein the first internal groove includes a first groove having a first line shape and extending away from a center of the first lens region on a plane in a first horizontal direction;

a second groove having a second line shape and extending away from the center of the first lens region in a first opposite direction that is opposite to the first horizontal direction;

a third groove having a third line shape and extending away from the center of the first lens region in a second horizontal direction perpendicular to the first horizontal direction; and a fourth groove having a fourth line shape and extending away from the center of the first lens region in a second opposite direction opposite to the second horizontal direction, wherein the first to fourth grooves are discontinuous from each other and spaced apart from the center of the first lens region, wherein the first, second, third, and fourth grooves are recessed relative to a level of a top surface of the lens material layer at the center of the first lens region.

2. The method of claim 1, wherein the lens patterns include a first lens pattern formed in the first lens region, and wherein, in the first lens pattern, curvatures in the first and second horizontal directions are different from curvatures in other horizontal directions that are different from the first and second horizontal directions.

3. The method of claim 1, wherein the plurality of lens regions include a second lens region adjacent to the first lens region, wherein the internal grooves include a second internal groove in the second lens region, and wherein the first internal groove has a shape different from a shape of the second internal groove.

4. The method of claim 3, wherein the lens patterns include a first lens pattern formed by the first lens region of the lens material layer and a second lens pattern formed by the second lens region of the lens material layer, and wherein a curvature of the first lens pattern is different from a curvature of the second lens pattern.

5. The method of claim 1, wherein the method further includes forming color filters on the second chip structure prior to the forming the lens material layer on the second chip structure, and wherein the color filters include a first color filter, a second color filter, and a third color filter having different colors.

6. The method of claim 5, wherein the lens patterns include a first lens pattern vertically overlapping the first color filter, a second lens pattern vertically overlapping the second color filter, and a third lens pattern vertically overlapping the third color filter, and wherein the first to third lens patterns have different curvatures.

7. The method of claim 6, wherein the first lens pattern has a first height, wherein the second lens pattern has a second height, wherein the third lens pattern has a third height, wherein the first height is lower than the second height, wherein the first height is higher than the third height, wherein the first color filter is a green color filter, wherein the second color filter is a red color filter, and wherein the third color filter is a blue color filter.

8. The method of claim 1, wherein the lens patterns include a fourth lens pattern vertically overlapping four adjacent photoelectric conversion device regions.

9. The method of claim 1, wherein forming the isolation groove and the internal grooves comprises applying a photo and etching process using a photomask pattern, and wherein the photomask pattern includes a same and uniform material through which the isolation groove and the internal grooves are formed.

10. The method of claim 1, wherein forming the isolation groove and the internal grooves comprises applying a photo and etching process using a photomask pattern, and wherein the photomask pattern includes an isolation opening corresponding to the isolation groove, and internal openings corresponding to the internal grooves.

11. The method of claim 1, wherein the lens patterns comprise the lens material layer, and wherein the forming the lens patterns includes:

performing a reflow process on the lens material layer in which the isolation groove and the internal grooves are formed; and performing an etch-back process on the lens material layer on which the reflow process has been performed, such that the lens material layer forms the lens patterns.

12. A method of manufacturing an image sensor, the method comprising:

forming a first chip structure including a circuit wiring structure;

forming a second chip structure including a plurality of photoelectric conversion device regions on the first chip structure;

forming a lens material layer on the second chip structure;

forming:

an isolation groove in the lens material layer, wherein the isolation groove defines a first lens region and a second lens region, and a first internal groove in the first lens region of the lens material layer, and a second internal groove in the second lens region of the lens material layer, wherein a depth by which the isolation groove is recessed is greater than depths by which the first internal groove and the second internal groove are recessed; and forming lens patterns having different curvatures using the lens material layer in which the isolation groove and the first and second internal grooves are formed, wherein a depth by which the first internal groove is recessed is greater than a depth by which the second internal groove is recessed, and wherein the first internal groove includes a first groove having a first line shape and extending away from a center of the first lens region on a plane in a first horizontal direction, a second groove having a second line shape and extending away from the center of the first lens region in a first opposite direction that is opposite to the first horizontal direction, a third groove having a third line shape and extending away from the center of the first lens region in a second horizontal direction perpendicular to the first horizontal direction, and a fourth groove having a fourth line shape and extending away from the center of the first lens region in a second opposite direction opposite to the second horizontal direction, wherein the first to fourth grooves are discontinuous from each other and spaced apart from the center of the first lens region, and wherein the first, second, third, and fourth grooves are recessed relative to a level of a top surface of the lens material layer at the center of the first lens region.

13. The method of claim 12, wherein the first and second internal grooves have different planar sizes.

14. The method of claim 12, wherein the lens material layer further includes a third lens region defined by the isolation groove and adjacent to the first and second lens regions, wherein the lens patterns include a first lens pattern formed by the first lens region of the lens material layer, a second lens pattern formed by the second lens region of the lens material layer, and a third lens pattern formed by the third lens region of the lens material layer, and wherein the first, second, and third lens patterns have different curvatures.

15. The method of claim 14, wherein the first, second, and third lens patterns have different heights.

16. A method of manufacturing an image sensor, the method comprising:

forming a chip structure including a photoelectric conversion device region;

forming a lens material layer on the chip structure;

forming an isolation groove and a first internal groove and a second internal groove in the lens material layer, wherein the first internal groove and the second internal groove are surrounded by the isolation groove, and wherein the first internal groove is in a first lens region defined by the isolation groove, and wherein the first internal groove and the second internal groove terminate above a level where the lens material layer is in contact with a layer underlying the lens material layer; and forming lens patterns using the lens material layer in which the isolation groove, the first internal groove, and the second internal groove are formed, wherein the first internal groove includes a first groove having a first line shape and extending away from a center of the first lens region on a plane in a first horizontal direction, a second groove having a second line shape and extending away from the center of the first lens region in a first opposite direction that is opposite to the first horizontal direction, a third groove having a third line shape and extending away from the center of the first lens region in a second horizontal direction perpendicular to the first horizontal direction, and a fourth groove having a fourth line shape and extending away from the center of the first lens region in a second opposite direction opposite to the second horizontal direction, wherein the first to fourth grooves are discontinuous from each other and spaced apart from the center of the first lens region, and wherein the first, second, third, and fourth grooves are recessed relative to a level of a top surface of the lens material layer at the center of the first lens region.

17. The method of claim 16, wherein the forming the lens patterns includes:

forming preliminary lens patterns by performing a reflow process on the lens material layer in which the isolation groove, the first internal groove, and the second internal groove are formed; and forming the lens patterns by performing an etch-back process on the preliminary lens patterns.

18. The method of claim 16, wherein the lens material layer includes the first lens region, a second lens region, and a third lens region distinct from each other by the isolation groove, wherein the second internal groove is formed in the second lens region, wherein the first and second internal grooves have different planar sizes, wherein a first lens pattern is formed by the first lens region of the lens material layer, a second lens pattern is formed by the second lens region of the lens material layer, and the lens patterns further include a third lens pattern formed by the third lens region of the lens material layer, and wherein the first, second, and third lens patterns have different heights.

* * * * *